(12) United States Patent
Yamazaki et al.

(10) Patent No.: US 7,456,430 B1
(45) Date of Patent: Nov. 25, 2008

(54) SEMICONDUCTOR DEVICE AND METHOD FOR FABRICATING THE SAME

(75) Inventors: Shunpei Yamazaki, Tokyo (JP); Jun Koyama, Kanagawa (JP); Toru Takayama, Kanagawa (JP); Toshiji Hamatani, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/544,801

(22) Filed: Apr. 7, 2000

(30) Foreign Application Priority Data

Apr. 12, 1999 (JP) .................... 11-104646

(51) Int. Cl.
*H01L 29/04* (2006.01)

(52) U.S. Cl. ............... 257/72; 257/59; 257/347; 257/350; 257/351; 257/344; 257/E27.111; 257/E29.275; 257/E29.278

(58) Field of Classification Search .......... 257/72, 257/350, 59, 366, 365, 66, 344, 347, 351, 257/E27.111, E29.274, E29.278, E29.293; 349/41, 42, 46
See application file for complete search history.

(56) References Cited

U.S. PATENT DOCUMENTS

| | | | | |
|---|---|---|---|---|
| 5,153,690 A | * | 10/1992 | Tsukada et al. | 357/23.7 |
| 5,245,207 A | | 9/1993 | Mikoshiba et al. | |
| 5,247,190 A | | 9/1993 | Friend et al. | 257/40 |
| 5,266,825 A | * | 11/1993 | Tsukada et al. | 257/366 |
| 5,343,063 A | * | 8/1994 | Yuan et al. | 257/317 |
| 5,399,502 A | | 3/1995 | Friend et al. | 437/1 |
| 5,402,254 A | * | 3/1995 | Sasano et al. | 359/59 |
| 5,594,569 A | | 1/1997 | Konuma et al. | |
| 5,643,826 A | | 7/1997 | Ohtani et al. | 437/88 |
| 5,671,027 A | * | 9/1997 | Sasano et al. | 349/46 |
| 5,734,185 A | * | 3/1998 | Iguchi et al. | 257/336 |
| 5,767,930 A | * | 6/1998 | Kobayashi et al. | 349/42 |

(Continued)

FOREIGN PATENT DOCUMENTS

CN 1123465 A 5/1996

(Continued)

OTHER PUBLICATIONS

Schenk, H. et al, "Polymers for Light Emitting Diodes," *EuroDisplay '99, Proceedings of the 19th International Display Research Conference*, Berlin, Germany, Sep. 6-9, 1999, pp. 33-37.

(Continued)

*Primary Examiner*—Sue A. Purvis
*Assistant Examiner*—Fazli Erdem
(74) *Attorney, Agent, or Firm*—Cook Alex Ltd.

(57) ABSTRACT

The invention primarily provides gate electrodes and gate wirings permitting large-sized screens for active matrix-type display devices, wherein, in order to achieve this object, the construction of the invention is a semiconductor device having, on the same substrate, a pixel TFT provided in a display region and a driver circuit TFT provided around the display region, wherein the gate electrodes of the pixel TFT and the driver circuit TFT are formed from a first conductive layer, the gate electrodes are in electrical contact through connectors with gate wirings formed from a second conductive layer, and the connectors are provided outside the channel-forming regions of the pixel TFT and the driver circuit TFT.

36 Claims, 23 Drawing Sheets

U.S. PATENT DOCUMENTS

| | | | |
|---|---|---|---|
| 5,793,460 A | 8/1998 | Yang | 349/148 |
| 5,888,858 A * | 3/1999 | Yamazaki et al. | 438/162 |
| 5,923,962 A | 7/1999 | Ohtani et al. | 438/150 |
| 6,067,132 A | 5/2000 | Kim | 349/47 |
| 6,146,930 A * | 11/2000 | Kobayashi et al. | 438/154 |
| 6,150,692 A * | 11/2000 | Iwanaga et al. | 257/315 |
| 6,171,910 B1 | 1/2001 | Hobbs et al. | |
| 6,271,573 B1 | 8/2001 | Suguro | |
| 6,323,068 B1 * | 11/2001 | Seo | 438/154 |
| 6,399,988 B1 | 6/2002 | Yamazaki | |
| 6,429,086 B1 | 8/2002 | Meikle et al. | 438/381 |
| 6,469,317 B1 * | 10/2002 | Yamazaki et al. | 257/59 |
| 6,504,215 B1 * | 1/2003 | Yamanaka et al. | 257/350 |
| 6,531,713 B1 | 3/2003 | Yamazaki | |
| 6,534,826 B2 | 3/2003 | Yamazaki | |
| 6,558,993 B2 | 5/2003 | Ohtani et al. | |
| 6,569,717 B1 * | 5/2003 | Murade | 438/149 |
| 6,573,564 B2 * | 6/2003 | Yamazaki et al. | 257/353 |
| 6,576,926 B1 | 6/2003 | Yamazaki et al. | |
| 6,579,736 B2 | 6/2003 | Yamazaki | |
| 6,593,592 B1 * | 7/2003 | Yamazaki et al. | 257/71 |
| 6,753,257 B2 | 6/2004 | Yamazaki | |
| 6,770,936 B2 | 8/2004 | Inoue et al. | 257/347 |
| 6,777,255 B2 | 8/2004 | Yamazaki | |
| 6,933,571 B2 | 8/2005 | Inoue et al. | 257/347 |
| 6,936,844 B1 | 8/2005 | Yamazaki et al. | |
| 7,015,141 B2 | 3/2006 | Yamazaki | |
| 7,049,634 B2 | 5/2006 | Yamazaki | |
| 2001/0025960 A1 * | 10/2001 | Ohtani et al. | 257/72 |
| 2001/0038097 A1 | 11/2001 | Inoue | 257/57 |
| 2006/0226430 A1 | 10/2006 | Yamazaki | |
| 2006/0249733 A1 | 11/2006 | Yamazaki et al. | |
| 2006/0261338 A1 | 11/2006 | Yamazaki et al. | |
| 2007/0224791 A1 | 9/2007 | Takayama et al. | |

FOREIGN PATENT DOCUMENTS

| | | | |
|---|---|---|---|
| EP | 0 582 486 | | 2/1994 |
| EP | 0 602 250 | | 6/1994 |
| EP | 0 645 802 | | 3/1995 |
| EP | 0 697 714 | A1 | 2/1996 |
| GB | 2 243 948 | A | 11/1991 |
| JP | 04-026825 | | 1/1992 |
| JP | 6-13605 | | 1/1994 |
| JP | 7-130652 | | 5/1995 |
| JP | 09260629 | * | 10/1997 |
| JP | 10-092576 | | 4/1998 |
| JP | 10-096962 | | 4/1998 |
| JP | 10-233505 | | 9/1998 |
| JP | 10-319431 | | 12/1998 |
| WO | WO 90/13148 | | 11/1990 |
| WO | WO 98/015973 | | 4/1998 |

OTHER PUBLICATIONS

English abstract re Japanese patent application No. 7-130652, published May 19, 1995.

English abstract re Japanese patent application No. 10-092576, published Apr. 10, 1998.

U.S. Appl. No. 09/528,113 (pending) to Yamazaki et al. including PTO filing receipt, claims, specification, abstract, and drawings.

U.S. Appl. No. 09/533,040 (issue fee) to Yamazaki including PTO filing receipt, specification, claims, abstract, drawings, and allowed claims.

U.S. Appl. No. 09/559,185 (pending) to Yamazaki including PTO filing receipt, specification, claims, abstract, drawings, and pending claims as of Apr. 9, 2002.

European Search Report re application No. EP 00107789.0, dated Jul. 4, 2006.

Office Action re Chinese application No. CN 200610073781.2, dated Apr. 4, 2008 (with English translation).

Office Action re Chinese patent application No. CN 200610103002.9, dated May 23, 2008 (wtih English translation).

Preliminary Amendment B, re U.S. Appl. No. 11/438,939, dated Nov. 3, 2006.

* cited by examiner

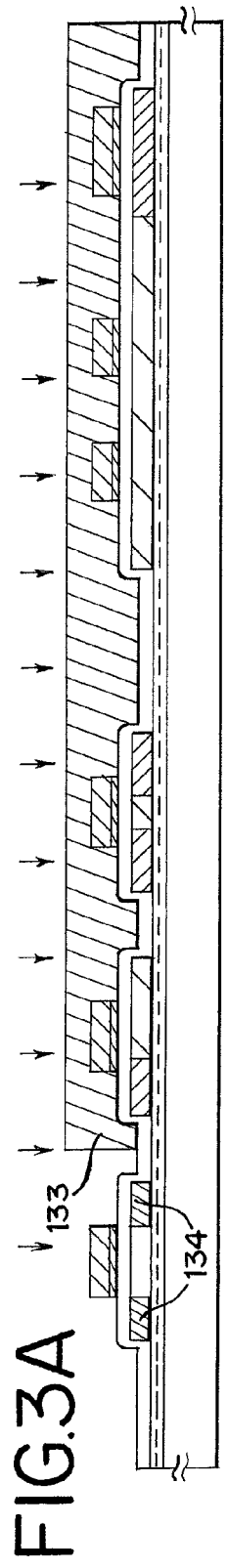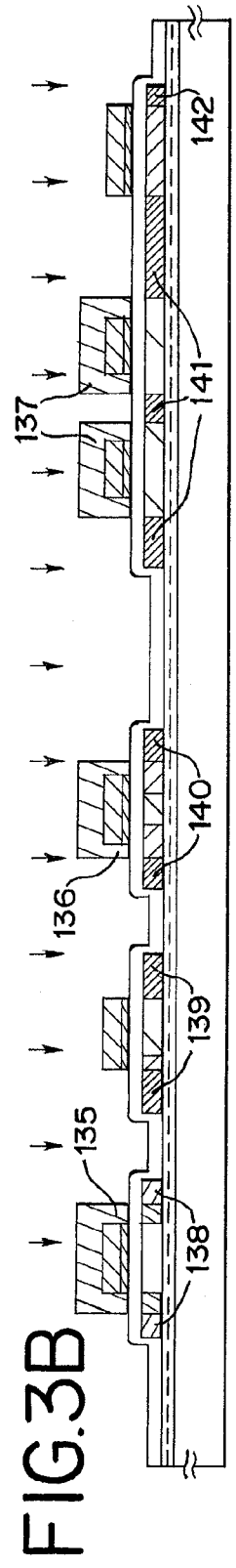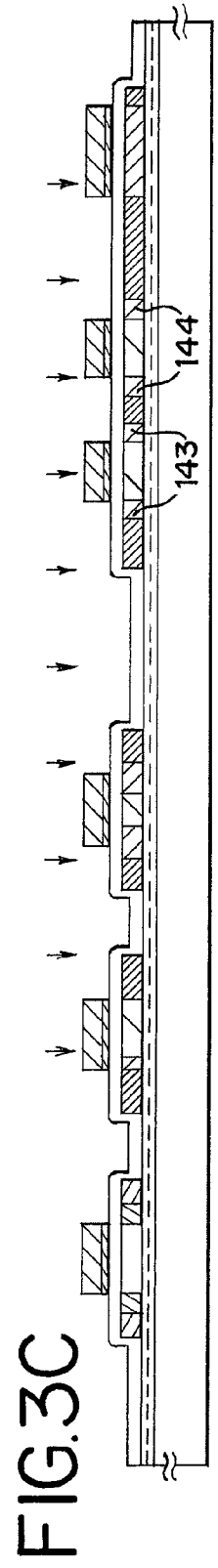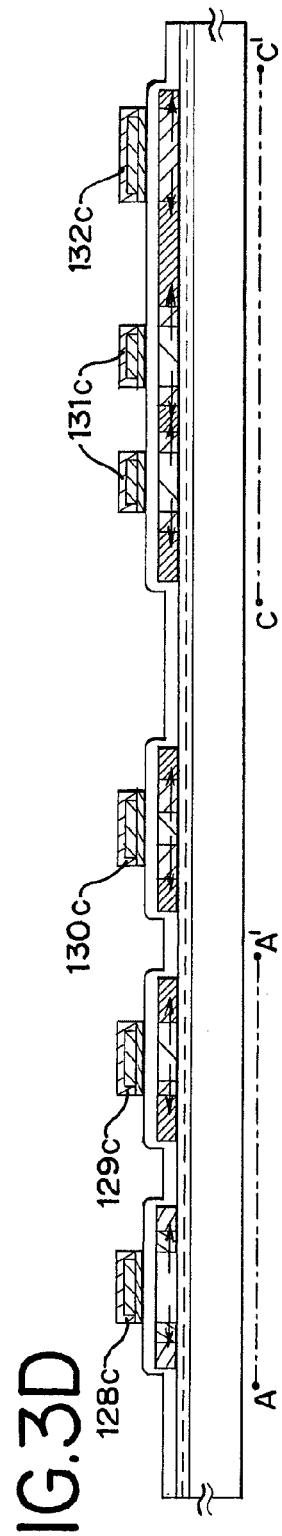

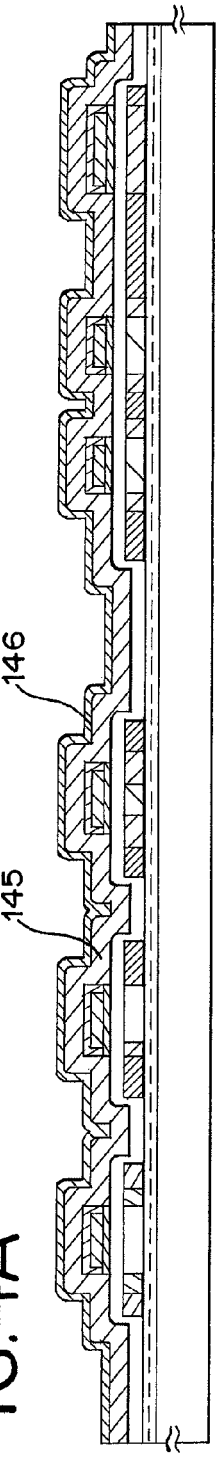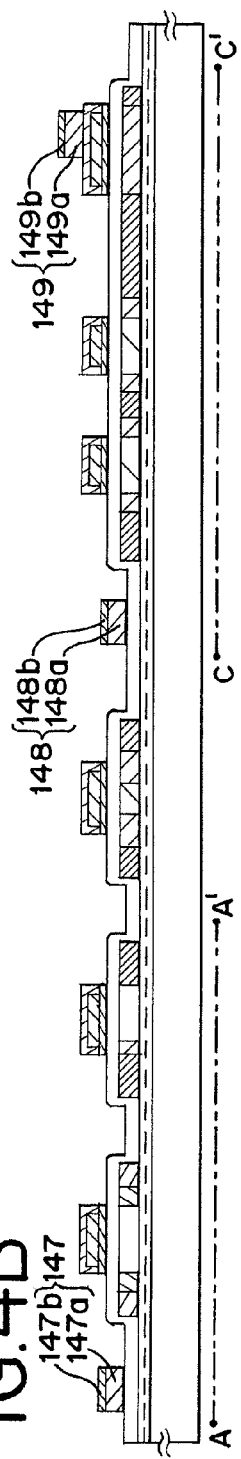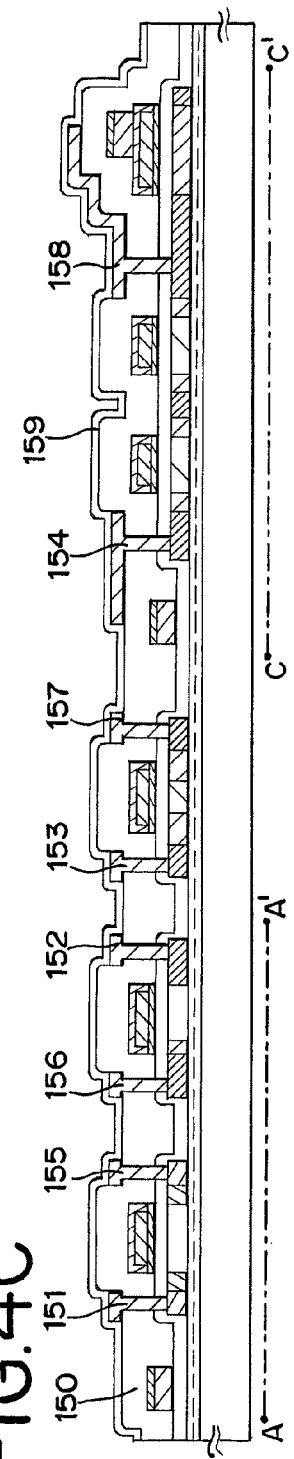

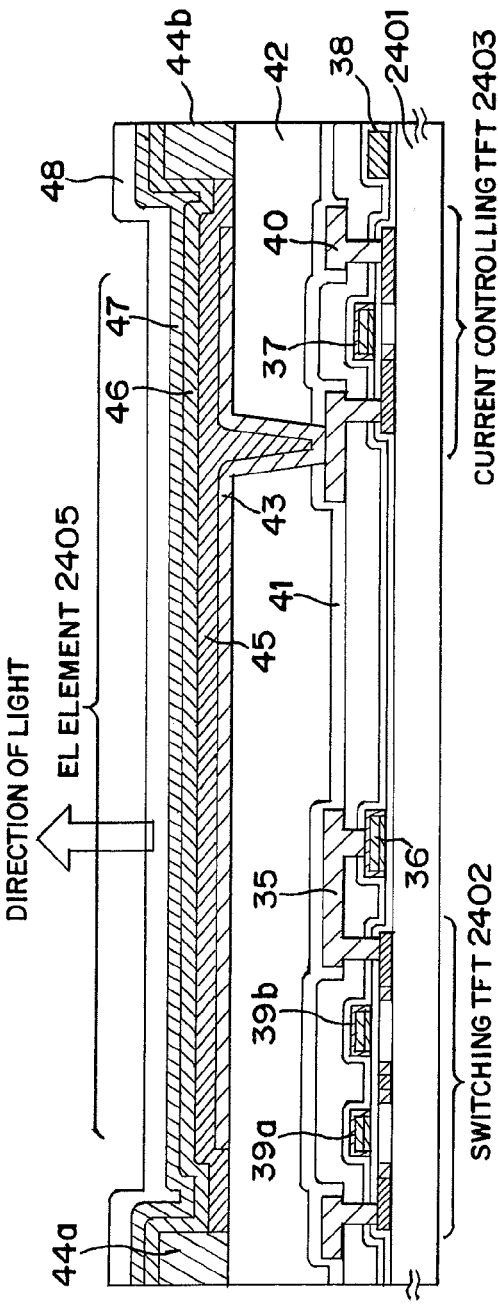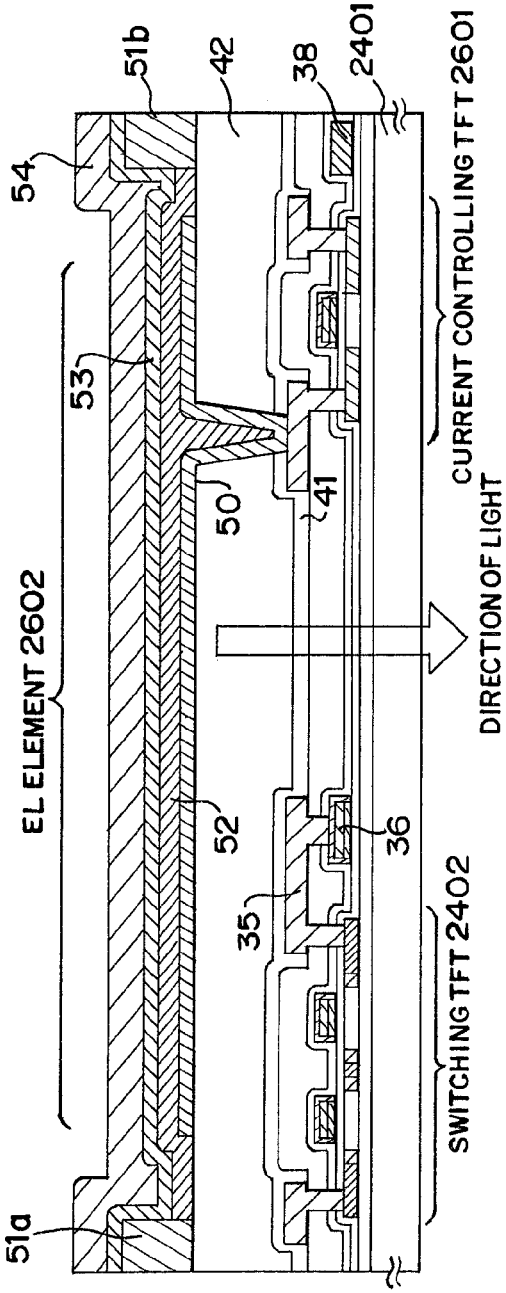

SEMICONDUCTOR DEVICE AND METHOD FOR FABRICATING THE SAME

BACKGROUND OF THE INVENTION

1. Field of the Invention

The present invention relates to a semiconductor device provided with an active circuit comprising a thin-film transistor (hereunder referred to as "TFT") on a substrate with an insulating surface. The invention may be used with particular advantages in electro-optical devices, a typical one being a liquid crystal display device having an image display region and its driver circuit formed on the same substrate, and in electro-optical device-mounted electronic instruments. Throughout the present specification, "semiconductor device" will refer to general devices that function based on semiconductor properties, and it will include in its scope the aforementioned electro-optical devices and electronic devices having the electro-optical devices mounted thereon.

2. Description of the Related Art

TFTs having semiconductor layers formed with crystalline silicon films (hereunder referred to as "crystalline silicon TFTs") have high field-effect mobility, and are therefore capable of forming circuits with various functions. Active matrix-type liquid crystal display devices employing crystalline silicon TFTs have an image display region and a driver circuit for image display formed on the same substrate. In the image display region there are provided a pixel TFT formed by an n-channel TFT, and a storage capacitor, while the driver circuit is constructed with a shift register circuit, level shifter circuit, buffer circuit, sampling circuit or the like, which is formed based on a CMOS circuit.

However, the operating conditions are not the same for the pixel TFT and the driver circuit TFT, and therefore different properties are often required for the TFTs. For example, the pixel TFT functions as a switch element and is driven by application of a voltage to the liquid crystals. Because the liquid crystals are driven by alternating current, it is most common to employ what are known as frame inversion driving systems. In such systems, the pixel TFT is required to have the property of a sufficiently low off-state current value (the drain current flowing when the TFT is off) in order to minimize power consumption. On the other hand, since a high driving voltage is applied to the buffer circuit of the driver circuit, it is necessary to increase the voltage resistance to prevent breakage upon application of the high voltage. Increased current driving capacity requires a sufficient guarantee for the on-state current value (the drain current flowing when the TFT is on).

The lightly doped drain (LDD) structure is known as a structure for a TFT exhibiting a reduced off-state current value. This structure is provided with a region having an impurity element added at a low concentration between a channel-forming region and a source region or drain region formed by addition of an impurity element to a high concentration, and this region is called the "LDD region". One means known for preventing deterioration of the on-state current value due to hot carriers is a structure known as a GOLD (Gate-drain Overlapped LDD), wherein the LDD region is placed lying over the gate electrode with a gate insulating film therebetween. This type of structure is known to be effective for preventing inclusion of hot carriers by attenuation of high voltage near the drain, thus avoiding the deterioration phenomenon.

At the same time, demands are increasing for larger sized and more intricate screens, to give greater product value to active matrix-type liquid crystal display devices. However, the larger sizes and greater intricacy of screens increases the number and length of the scanning lines (gate wirings), thus heightening the necessity for low resistance of the gate wirings. That is, as the number of scanning lines increases, the charging time for the crystals is shortened, such that the time constant for the gate wiring (resistance×capacity) must be reduced for a faster response. For example, if the resistivity of the material forming the gate wiring is 100 μΩcm the limit to the screen size will be about 6 inches, but for 3 μΩcm a display corresponding to 27 inches is possible.

Still, the properties required for a pixel TFT of a pixel matrix circuit and a TFT of a driver circuit such as a shift register circuit or buffer circuit are not always the same. For example, in a pixel TFT, a large reverse bias (a negative voltage in the case of an n-channel TFT) is applied to the gate, but a driver circuit TFT will basically fail to operate in a reverse bias state. The operating speed of a pixel TFT is also sufficient at less than 1/100 that of a driver circuit TFT.

In addition, while a GOLD structure provides a strong effect of preventing on-state current value deterioration, it has also presented the problem of a larger off-state current value compared to the usual LDD structure. Thus, it has not been a preferred structure for application to pixel TFTs. Conversely, the usual LDD structure has a strong effect of minimizing the off-state current value but has had a low effect of preventing deterioration due to hot carrier inclusion by attenuation of the electric field near the drain. Consequently, it has not always been preferable to form all the TFTs with the same structure in semiconductor devices comprising multiple integrated circuits with different operating conditions, such as active matrix-type liquid crystal display devices. These problems have become more conspicuous particularly in crystalline silicon TFTs with higher characteristics, and as greater performance has been required for active matrix-type liquid crystal display devices.

The use of aluminum (Al) and copper (Cu) as wiring materials has been considered for realization of large-sized active matrix-type liquid crystal display devices, but this has presented drawbacks such as poor corrosion resistance and heat resistance. Consequently, these materials are not necessarily preferred for formation of TFT gate electrodes, and it has not been easy to introduce such materials into the TFT manufacturing process. Wirings can of course be formed with other conductive materials, but there are no materials with such low resistance as aluminum (Al) and copper (Cu), and this has hampered fabrication of large-sized display devices.

SUMMARY OF THE INVENTION

In order to solve the problems discussed above, the construction of the present invention is that of a semiconductor device having, on the same substrate, a pixel TFT provided in a display region and a driver circuit TFT provided around the display region, wherein the pixel TFT and the driver circuit TFT have gate electrodes formed from a first conductive layer, the gate electrodes are in electrical contact through connectors with gate wirings formed from a second conductive layer, and the connectors are provided outside the channel-forming regions of the pixel TFT and the driver circuit TFT.

Another construction of the invention is that of a semiconductor device having, on the same substrate, a pixel TFT provided in a display region and a driver circuit TFT provided around the display region, wherein the pixel TFT and the driver circuit TFT have gate electrodes formed from a first conductive layer, the gate electrodes are in electrical contact with gate wirings formed from a second conductive layer, through connectors provided outside the channel-forming regions of the pixel TFT and the driver circuit TFT, the LDD regions of the pixel TFT are disposed without overlapping the gate electrode of the pixel TFT, the LDD regions of the first n-channel TFT of the driver circuit are disposed so as to overlap the gate electrode of the first n-channel TFT, and the LDD regions of the second n-channel TFI of the driver circuit are disposed so that at least a portion thereof overlaps the gate electrode of the first n-channel TFT.

In this construction of the invention, the first conductive layer has a conductive layer (A) containing nitrogen and at least one selected from among tantalum, tungsten, titanium and molybdenum, a conductive layer (B) formed on the conductive layer (A) and composed mainly of at least one selected from among tantalum, tungsten, titanium and molybdenum and a conductive layer (C) formed on the areas where the conductive layer (B) does not contact the conductive layer (A) and containing nitrogen and at least one selected from among tantalum, tungsten, titanium and molybdenum, while the second conductive layer has a conductive layer (D) composed mainly of aluminum or copper and a conductive layer (E) composed mainly of at least one selected from among tantalum, tungsten, titanium and molybdenum, and the conductive layer (C) and conductive layer (D) are in contact at the connectors. The conductive layer (B) contains argon as an added element, and the oxygen concentration in the conductive layer (B) is 30 ppm or less.

In order to solve the aforementioned problems, the method for fabricating a semiconductor device according to the invention is a method for fabrication of a semiconductor device having, on the same substrate, a pixel TFT provided in a display region and a driver circuit TFT provided around the display region, the method comprising a step of forming gate electrodes for the pixel TFT and the driver circuit TFT from a first conductive layer, and a step of forming gate wirings connected to the gate electrodes from a second conductive layer, wherein the gate electrodes and the gate wirings are connected through connectors provided outside the channel-forming regions of the pixel TFT and the driver circuit TFT.

The method for fabricating a semiconductor device according to the invention is also a method for fabrication of a semiconductor device having, on the same substrate, a pixel TFT provided in a display region and a driver circuit TFT provided around the display region, the method comprising a first step of selectively adding an n-type impurity element to the first and second n-channel TFT semiconductor layers forming the driver circuit to a concentration range of $2 \times 10^{16}$ to $5 \times 10^{19}$ atoms/cm$^3$, a second step of forming gate electrodes for the pixel TFT and the driver circuit TFT from a first conductive layer, a third step of selectively adding a p-type impurity element to the p-channel TFT semiconductor layers forming the driver circuit to a concentration range of $3 \times 10^{20}$ to $3 \times 10^{21}$ atoms/cm$^3$, a fourth step of selectively adding an n-type impurity element to the first and second n-channel TFT semiconductor layers forming the driver circuit and the semiconductor layer of the pixel TFT to a concentration range of $1 \times 10^{20}$ to $1 \times 10^{21}$ atoms/cm$^3$, a fifth step of selectively adding an n-type impurity element to the semiconductor layer of the pixel TFT to a concentration range of $1 \times 10^{16}$ to $5 \times 10^{18}$ atoms/cm$^3$, using at least the gate electrode of said n-channel TFT as a mask, and a sixth step of forming gate wirings for the pixel TFT and the driver circuit TFT from a second conductive layer, wherein the gate electrodes and the gate wirings are connected through connectors provided outside the channel-forming regions of the pixel TFT and the driver circuit TFT.

In the method for fabrication of a semiconductor device according to the invention, the first conductive layer is formed by a step of forming a conductive layer (A) containing nitrogen and at least one selected from among tantalum, tungsten, titanium and molybdenum, a step of forming a conductive layer (B) formed on the conductive layer (A) and composed mainly of at least one selected from among tantalum, tungsten, titanium and molybdenum, and a step of forming a conductive layer (C) formed on the areas where the conductive layer (B) does not contact the conductive layer (A) and containing nitrogen and at least one selected from among tantalum, tungsten, titanium and molybdenum, while the second conductive layer is formed by at least a step of forming a conductive layer (D) composed mainly of aluminum or copper and a step of forming a conductive layer (E) composed mainly of at least one selected from among tantalum, tungsten, titanium and molybdenum, and conductive layer (C) and conductive layer (D) are in contact at the connectors. The conductive layer (A) may be formed by a sputtering method using a target composed mainly of at least one selected from among tantalum, tungsten, titanium and molybdenum, in a mixed atmosphere of argon and nitrogen or ammonia, and the conductive layer (C) is preferably formed by heat treating conductive layer (B) in a nitrogen atmosphere with an oxygen concentration of 1 ppm or less. Conductive layer (C) may also be formed by heat treating conductive layer (B) in a nitrogen plasma atmosphere with an oxygen concentration of 1 ppm or less.

BRIEF DESCRIPTION OF THE DRAWINGS

FIGS. 3A to 3D are cross-sectional views of fabrication steps for a pixel TFT, a storage capacitor and a driver circuit TFT;

FIGS. 4A to 4C is cross-sectional views of fabrication steps for a pixel TFT, a storage capacitor and a driver circuit TFT;

FIGS. 19A and 19B are cross sectional views of a pixel portion of an EL display device;

DETAILED DESCRIPTION OF THE PREFERRED EMBODIMENTS

Embodiment Mode 1

Embodiment of the present invention will now be explained with reference to FIGS. 1 to 5. The detailed description that follows will deal with the steps of a process whereby the pixel TFT in the display region and the driver circuit TFT formed around the display region are fabricated on the same substrate. To simplify the explanation, however, the driver circuit will be illustrated with a shift register circuit, a CMOS circuit as the basic circuit, such as a buffer circuit, and an n-channel TFT forming a sampling circuit.

Figure 1A:
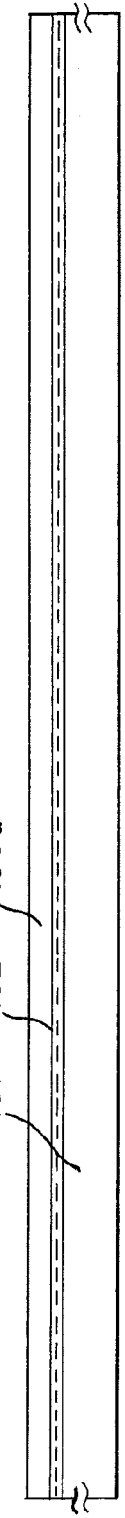
FIGS. 1A to 1D are cross-sectional views of fabrication steps for a pixel TFT, a storage capacitor and a driver circuit TFT.

For FIG. 1A, a low alkali glass substrate or a quartz substrate may be used as the substrate 101. In this embodiment, a low alkali glass substrate was used. It may be heat treated beforehand at a temperature about 10-20° C. lower than the glass strain temperature. On the surface of the substrate 101 on which the TFT is formed, there is formed a base film 102 such as a silicon oxide film, silicon nitride film or silicon oxynitride film, in order to prevent diffusion of the impurity from the substrate 101. For example, the plasma CVD method is used to form a laminate of a silicon oxynitride film made from $SiH_4$, $NH_3$ and $N_2O$ to a thickness of 100 nm and a silicon oxynitride film made from $SiH_4$ and $N_2O$ to a thickness of 200 nm.

Next, a semiconductor film 103a having an amorphous structure with a thickness of 20-150 nm (preferably 30-80 nm) is formed by a publicly known method such as plasma CVD or sputtering. In this embodiment, an amorphous silicon film was formed to a thickness of 55 nm by plasma CVD. Semiconductor films with amorphous structures include amorphous semiconductor films and fine crystalline semiconductor films, and a compound semiconductor film with an amorphous structure, such as an amorphous silicon-germanium film, may also be used. Since the base film 102 and the amorphous silicon film 103a can be formed by the same film forming method, they may be made by continuous formation. After forming the base film, contamination of the surface can be prevented by once removing it from the air atmosphere, thus reducing fluctuation of the TFT properties and variation in the threshold voltage of the fabricated TFT (FIG. 1A).

Figure 1B:
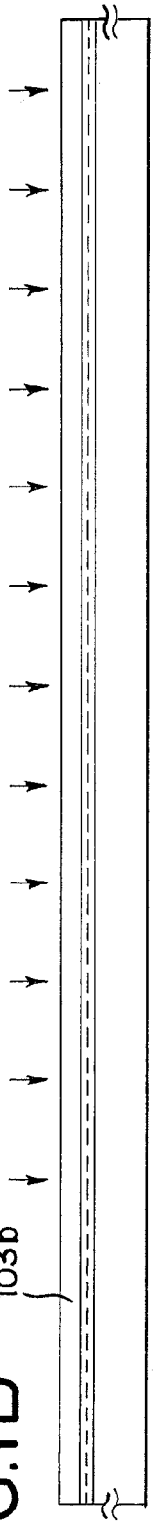

A publicly known crystallizing technique is then used to form a crystalline silicon film 103b from the amorphous silicon film 103a. For example, a laser crystallizing or heat crystallizing method (solid phase growth method) may be used, and here a crystalline silicon film 103b was formed by a crystallization method using a catalyst element, according to the technique disclosed in Japanese Laid-Open Patent Publication No. 7-130652. Before the crystallization step, although it will depend on the moisture content of the amorphous silicon film, heat treatment is preferably effect for about one hour at 400-500° C. to reduce the moisture content to under 5 atom % prior to crystallization. Crystallization of the amorphous silicon film causes rearrangement of the atoms to a more dense form, so that the thickness of the crystalline silicon film that is fabricated is reduced by about 1-15% from the thickness of the original amorphous silicon film (55 nm in this embodiment) (FIG. 1B).

Figure 1C:
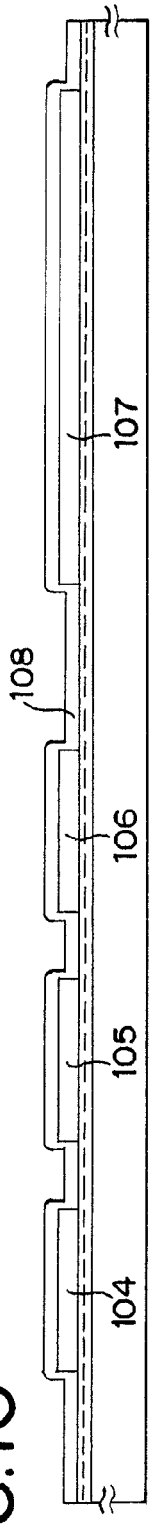

The crystalline silicon film 103b is then separated into insular sections to form insular semiconductor layers 104-107. A mask layer 108 is then formed by a silicon oxide film with a thickness of 50-100 nm by plasma CVD or sputtering (FIG. 1C).

A resist mask 109 was provided, and boron (B) was added as a p-type impurity element at a concentration of about $1 \times 10^{16}$ to $5 \times 10^{17}$ atoms/$cm^3$ for the purpose of limiting the threshold voltage of the insular semiconductor layers 105-107 forming the n-channel TFT. The addition of boron (B) may be accomplished by an ion doping method, or it may be added simultaneously with formation of the amorphous silicon film. While the addition of boron (B) is not necessarily essential, the semiconductor layers 110-112 were preferably formed with boron (B) added thereto to keep the threshold voltage of the n-channel TFT in the prescribed range (FIG. 1D).

To form the LDD regions of the n-channel TFT of the driver circuit, an n-type impurity element is selectively added to the insular semiconductor layers 110, 111. A resist mask 113-116 is formed beforehand for this purpose. The n-type impurity element used may be phosphorus (P) or arsenic (As), and in this case an ion doping method was employed using phosphine ($PH_3$) for addition of phosphorus (P). The phosphorus (P) concentration of the formed impurity regions 117, 118 may be in the range of $2 \times 10^{16}$ to $5 \times 10^{19}$ atoms/$cm^3$. Throughout the present specification, the concentration of the n-type impurity element in the impurity regions 117-119 formed here will be represented as ($n^-$). The impurity region 119 is a semiconductor layer for formation of the storage capacitor of the pixel matrix circuit, and phosphorus (P) was added at the same concentration in this region as well (FIG. 2A).

Figure 1D:
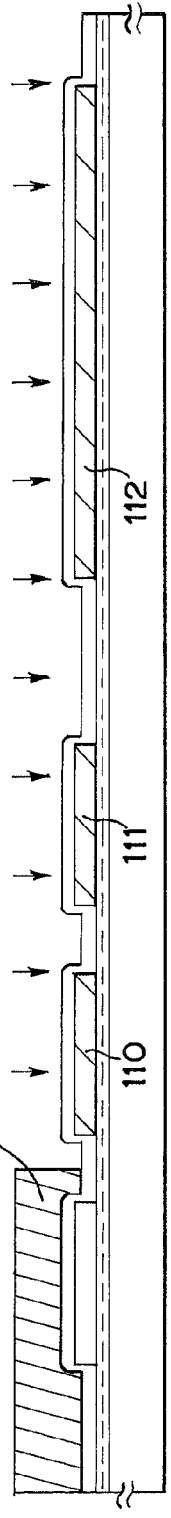
Figure 2A:
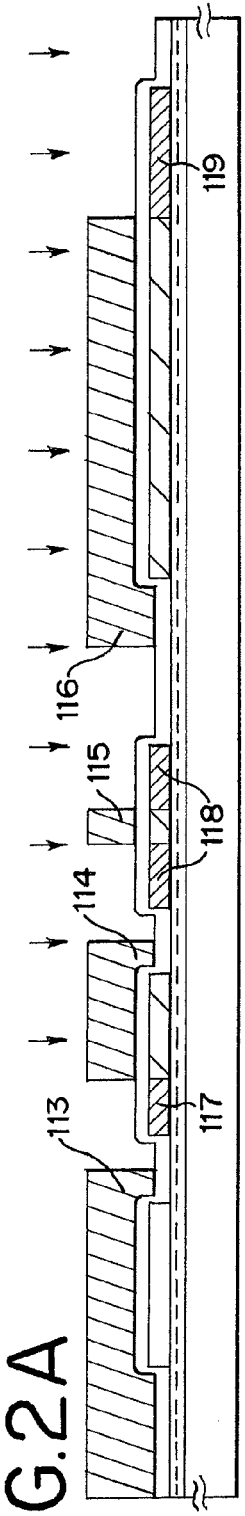
FIGS. 2A to 2D are cross-sectional views of fabrication steps for a pixel TFT, a storage capacitor and a driver circuit TFT.

This is followed by a step of removing the mask layer 108 by hydrofluoric acid or the like, and activating the impurity elements added in FIG. 1D and FIG. 2A. The activation may be carried out by heat treatment for 1-4 hours at 500-600° C. in a nitrogen atmosphere, or by a laser activation method. These may also be carried out in combination. In this embodiment, a laser activation method was used, with KrF excimer laser light (248 nm wavelength) to form a linear beam, for scanning at an oscillation frequency of 5-50 Hz and an energy density of 100-500 mJ/$cm^2$ with 80-98% linear beam overlap, to treat the entire substrate on which the insular semiconductor layers had been formed. There are no particular restrictions on the laser light irradiation conditions, and they may be appropriately set by the operator.

Figure 2B:
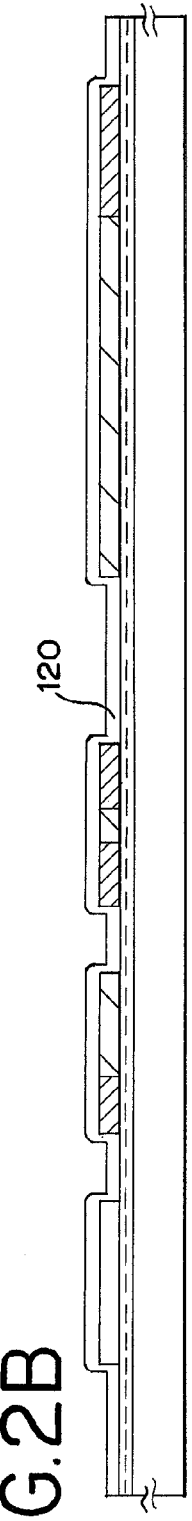

A gate insulating film 120 is then formed with a silicon-containing insulating film to a thickness of 10-150 nm using plasma CVD or sputtering. For example, a silicon oxynitride film is formed to a thickness of 120 nm. The gate insulating film may also be a single layer or multi-layer structure of other silicon-containing insulating films (FIG. 2B).

A first conductive layer is then made to form the gate electrodes. This first conductive layer may be formed as a single layer, but if necessary it may also have a laminated structure of two or three layers. In this embodiment, a conductive layer (A) 121 made of a conductive metal nitride film and a conductive layer (B) 122 made of a metal film were laminated. The conductive layer (B) 122 may be formed of an element selected from among tantalum (Ta), titanium (Ti), molybdenum (Mo) and tungsten (W), or an alloy composed mainly of one of these elements, or an alloy film comprising a combination of these elements (typically a Mo—W alloy film or Mo—Ta alloy film), and the conductive layer (A) 121 is formed of tantalum nitride (TaN), tungsten nitride (WN), titanium nitride (TiN) or molybdenum nitride (MoN). As alternative materials for the conductive layer (A) 121 there may be used tungsten silicide, titanium silicide or molybdenum silicide. The conductive layer (B) may have a reduced impurity concentration for the purpose of lower resistance, and in particular the oxygen concentration was satisfactory at under 30 ppm. For example, tungsten (W) with an oxygen concentration of under 30 ppm allowed realization of a resistivity of under 20 μΩcm.

Figure 2C:
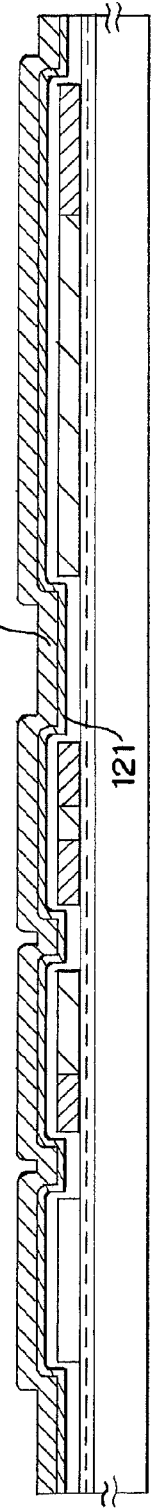

The conductive layer (A) 121 may be 10-50 nm (preferably 20-30 nm) and the conductive layer (B) 122 may be 200-400 nm (preferably 250-350 nm). In this embodiment, a tantalum nitride film with a thickness of 30 nm was used as the conductive layer (A) 121 and a Ta film of 350 nm was used as the conductive layer (B) 122, and both were formed by sputtering. In this film formation by sputtering, addition of an appropriate amount of Xe or Kr to the Ar sputtering gas can alleviate the internal stress of the formed film to thus prevent peeling of the film. Though not shown, it is effective to form a silicon film doped with phosphorus (P) to a thickness of about 2-20 nm under the conductive layer (A) 121. This can improve adhesion and prevent oxidation of the conductive film formed thereover, while also preventing diffusion of trace alkali metal elements in the conductive layer (A) or conductive layer (B) into the gate insulating film 120 (FIG. 2C).

Figure 2D:
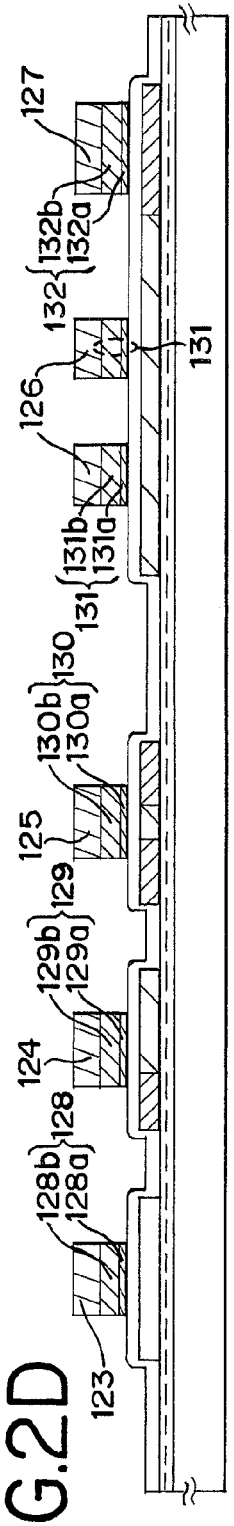

A resist mask 123-127 is then formed, and the conductive layer (A) 121 and conductive layer (B) 122 are etched together to form gate electrodes 128-131 and a capacitor wiring 132. The gate electrodes 128-131 and capacitor wiring 132 comprise the integrally formed sections 128a-132a consisting of conductive layer (A) and sections 128b-132b consisting of conductive layer (B). Here, the gate electrodes 129, 130 formed in the driver circuit are formed so as to overlap with a portion of the impurity regions 117, 118 via the gate insulating layer 120 (FIG. 2D).

This is followed by a step of adding a p-type impurity element to form the p-channel TFT source region and drain region of the driver circuit. Here, the gate electrode 128 is used as a mask to form self-aligning impurity regions. The region in which the n-channel TFT is formed is covered at this time with a resist mask 133. The impurity regions 134 are formed by an ion doping method using diborane ($B_2H_6$). The boron (B) concentration of this region is $3\times10^{20}$ to $3\times10^{21}$ atoms/cm$^3$. Throughout this specification, the concentration of the p-type impurity element in the impurity regions 134 formed here will be represented as (p$^+$) (FIG. 3A).

Next, impurity regions functioning as a source region or drain region were formed in the n-channel TFT. Resist masks 135-137 were formed, and an n-type impurity element was added to form impurity regions 138-142. This was accomplished by an ion doping method using phosphine ($PH_3$), and the phosphorus (P) concentration in the regions was in the range of $1\times10^{20}$ to $1\times10^{21}$ atoms/cm$^3$. Throughout the present specification, the concentration of the n-type impurity element in the impurity regions 138-142 formed here will be represented as (n$^+$) (FIG. 3B).

The impurity regions 138-142 already contain phosphorus (P) or boron (B) added in the previous step, but since a sufficiently high concentration of phosphorus (P) is added in comparison, the influence of the phosphorus (P) or boron (B) added in the previous step may be ignored. As the concentration of phosphorus (P) added to the impurity region 138 is ½ to ⅓ of the boron (B) concentration added in FIG. 3A, the p-type conductivity is guaranteed so that there is no effect on the properties of the TFT.

This was followed by a step of adding an n-type impurity to form an LDD region in the n-channel TFT of the pixel matrix circuit. Here, the gate electrodes 131 were used as a mask for self-aligning addition of an n-type impurity element by an ion doping method. The concentration of phosphorus (P) added was $1\times10^{16}$ to $5\times10^{18}$ atoms/cm$^3$, and addition of a lower concentration than the concentrations of the impurity elements added in FIG. 2A, FIG. 3A and FIG. 3B, substantially forms only impurity regions 143, 144. Throughout this specification, the concentration of the n-type impurity element in these impurity regions 143, 144 will be represented as (n$^{--}$) (FIG. 3C).

This was followed by a step of heat treatment for activation of the n-type or p-type impurity element added at their respective concentrations. This step can be accomplished by the furnace anneal method, laser anneal method or rapid thermal anneal method (RTA method). Here, the activation step was accomplished by the furnace anneal method. The heat treatment is carried out in a nitrogen atmosphere with an oxygen concentration of no greater than 1 ppm and preferably no greater than 0.1 ppm, at 400-800° C. and typically 500-600° C., and for this embodiment the heat treatment was carried out at 550° C. for 4 hours. When a heat resistant material such as a quartz substrate is used for the substrate 101, the heat treatment may even be at 800° C. for one hour, and this allowed activation of the impurity element and formation of a satisfactory bond between the impurity element-added impurity region and the channel-forming region.

In the heat treatment, conductive layers (C) 128c-132c are formed to a thickness of 5-80 nm from the surfaces of the metal films 128b-132b forming the gate electrodes 128-131 and the capacitor wiring 132. For example, when the conductive layers (B) 128b-132b are of tungsten (W), tungsten nitride (WN) is formed, whereas when tantalum (Ta) is used, tantalum nitride (TaN) may be formed. The conductive layers (C) 128c-132c may be formed in the same manner by exposing the gate electrodes 128-131 to a nitrogen-containing plasma atmosphere, using either nitrogen or ammonia. A step was also performed for hydrogenation of the insular semiconductor layer by heat treatment at 300-450° C. for 1-12 hours in an atmosphere containing 3-100% hydrogen. This step is a step for terminating the dangling bond of the semiconductor layer by thermally excited hydrogen. Plasma hydrogenation (using plasma-excited hydrogen) may also be carried out as another means for hydrogenation.

When the insular semiconductor layer was fabricated by a method of crystallization from an amorphous silicon film using a catalyst element, the catalyst element remained in a trace amount in the insular semiconductor layers. While the TFTI can of course be completed even in this condition, it is more preferable for the residual catalyst element to be eliminated at least from the channel-forming region. One means used to eliminate the catalyst element was utilizing the gettering effect by phosphorus (P). The phosphorus (P) concentration necessary for gettering is on the same level as the impurity region (n$^+$) formed in FIG. 3B, and the heat treatment for the activation step carried out here allowed gettering of the catalyst element from the channel-forming region of the n-channel TFT and p-channel TFT (FIG. 3D).

Figure 6A:
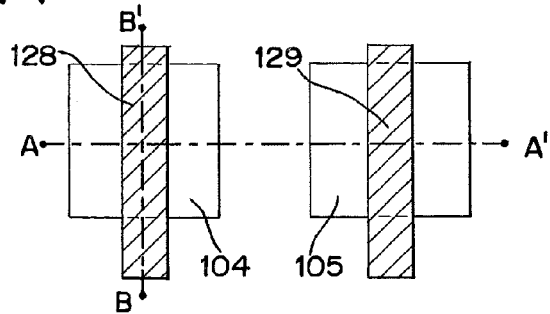
FIGS. 6A to 6C are top views of fabrication steps for a pixel TFT, a storage capacitor and a driver circuit TFT.
Figure 6B:
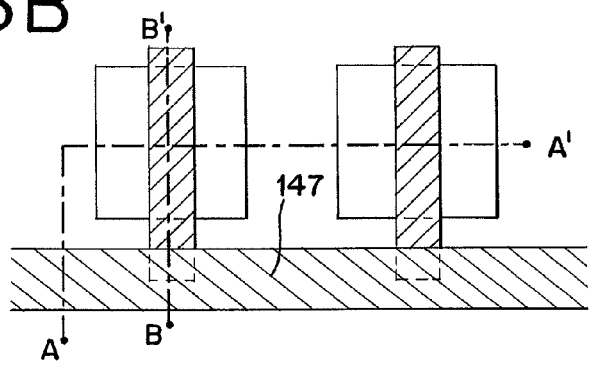
Figure 6C:
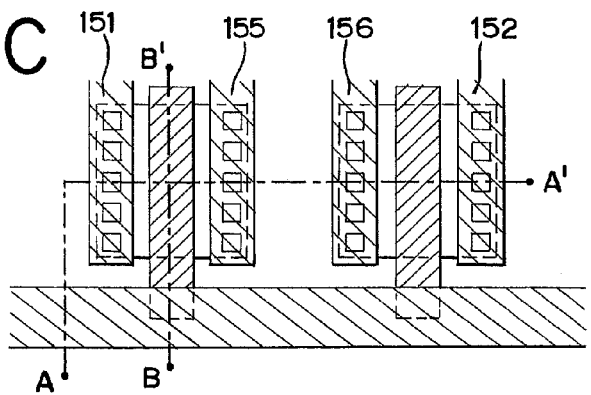
Figure 7A:
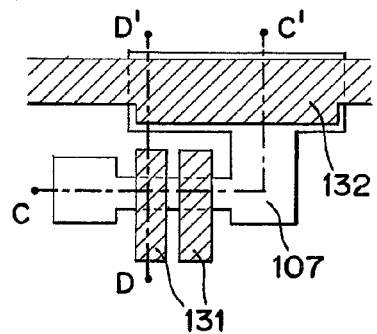
FIGS. 7A to 7C are top views of fabrication steps for a pixel TFT, a storage capacitor and a driver circuit TFT.
Figure 8A:
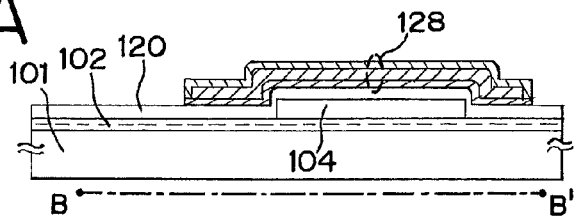
FIGS. 8A to 8C are cross-sectional views of fabrication steps for a drive circuit TFT.
Figure 9A:
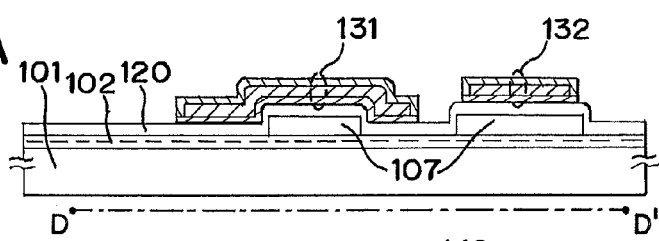
FIGS. 9A to 9C are cross-sectional views of fabrication steps for a pixel TFT.

FIG. 6A and FIG. 7A are top views of a TFT up to this step, where cross-section A-A' and cross-section C-C' correspond to A-A' and C-C' in FIG. 3D. Cross-section B-B' and cross-section D-D' correspond to the cross-sectional views of FIG. 8A and FIG. 9A. The top views of FIGS. 6A to 6C and FIGS. 7A to 7C omit the gate electrode films, but up to this step, at least the gate electrodes 128-131 and capacitor wiring 132 are formed on the insular semiconductor layers 104-107, as shown.

After completion of the steps of activation and hydrogenation, the second conductive layer to serve as the gate wiring is formed. This second conductive layer may be formed with a conductive layer (D) composed mainly of aluminum (Al) or copper (Cu) as low resistance materials, and a conductive layer (E) made of titanium (Ti), tantalum (Ta), tungsten (W) or molybdenum (Mo). In this embodiment, the conductive layer (D) 145 was an aluminum (Al) film containing 0.1-2 wt % titanium (Ti), and the conductive layer (E) 146 was a titanium (Ti) film. The conductive layer (D) 145 may be formed to 200-400 nm (preferably 250-350 nm), and the conductive layer (E) 146 may be formed to 50-200 nm (preferably 100-150 nm) (FIG. 4A).

The conductive layer (E) 146 and conductive layer (D) 145 were subjected to etching treatment to form the gate wiring connecting the gate electrodes, thus forming gate wirings 147, 148 and capacitor wiring 149. The etching treatment first accomplished removal from the surface of the conductive layer (E) to partway through the conductive layer (D) by a dry etching method using a mixed gas of SiCl$_4$, Cl$_2$ and BCl$_3$, and then wet etching was performed with a phosphoric acid-based etching solution to remove the conductive layer (D), thus allowing formation of a gate wiring while maintaining selective working with the base layer.

Figure 7B:
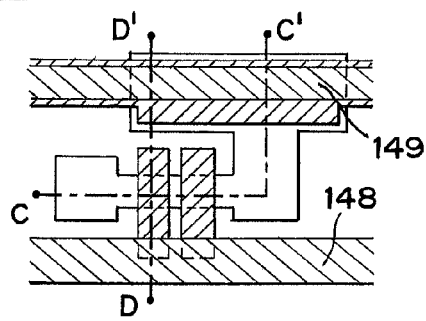
Figure 8B:
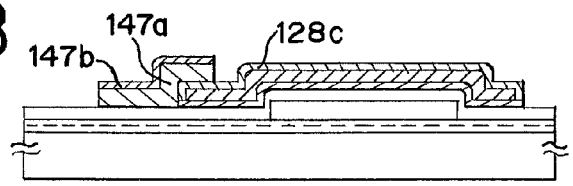
Figure 9B:
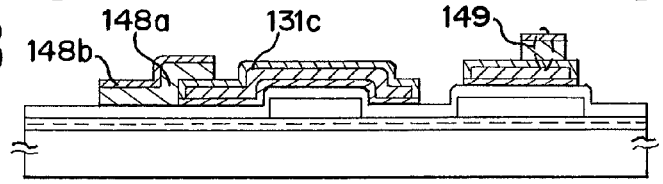

FIG. 6B and FIG. 7B are top views of this state, where cross-section A-A' and cross-section C-C' correspond to A-A' and C-C' in FIG. 4B. Cross-section B-B' and cross-section D-D' correspond to the B-B' and D-D' in FIG. 8B and FIG. 9B. In FIG. 6B and FIG. 7B, part of the gate wirings 147, 148 overlap and are in electrical contact with part of the gate electrodes 128, 129, 131. This condition is clearly shown in the cross-sectional structural diagrams of FIG. 8B and FIG. 9B corresponding to cross-section B-B' and cross-section D-D', where conductive layer (C) forming the first conductive layer and conductive layer (D) forming the second conductive layer are in electrical contact.

A first interlayer insulating film 150 is formed with a silicon oxide film or silicon oxynitride film to a thickness of 500-1500 nm, after which contact holes are formed reaching to the source region or drain region formed in each insular semiconductor layer, to form source wirings 151-154 and drain wirings 155-158. While not shown here, in this embodiment the electrode has a three-layer laminated structure with continuous formation of a Ti film to 100 nm, a Ti-containing aluminum film to 300 nm and a Ti film to 150 nm by sputtering.

Next, a silicon nitride film, silicon oxide film or a silicon oxynitride film is formed to a thickness of 50-500 nm (typically 100-300 nm) as a passivation film 159. Hydrogenation treatment in this state gave favorable results for enhancement of the TFT characteristics. For example, heat treatment may be carried out for 1-12 hours at 300-450° C. in an atmosphere containing 3-100% hydrogen, or a similar effect may be achieved by using a plasma hydrogenation method. Here, an opening may be formed in the passivation film 159 at the position where the contact holes are to be formed for connection of the pixel electrodes and the drain wirings (FIG. 4C).

Figure 7C:
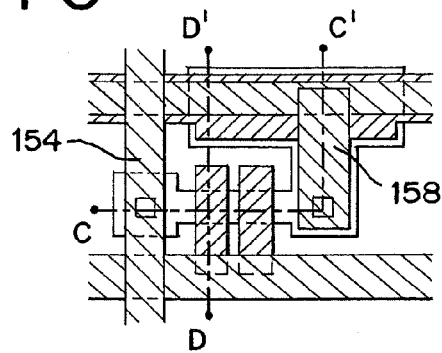
Figure 8C:
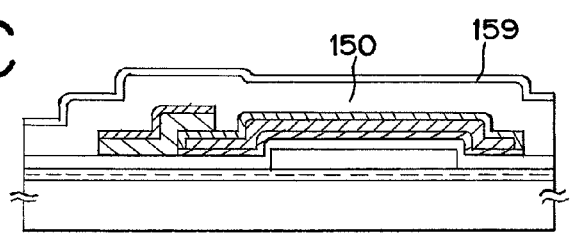
Figure 9C:
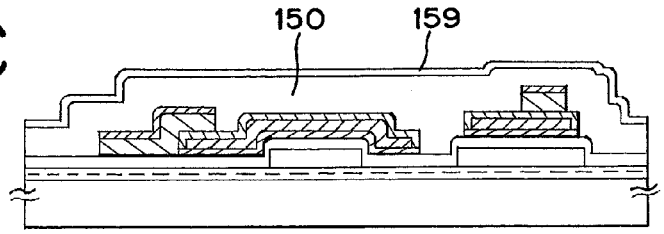

FIG. 6C and FIG. 7C show top views of this condition, where cross-section A-A' and cross-section C-C' correspond to A-A' and C-C' in FIG. 4C. Cross-section B-B' and cross-section D-D' correspond to B-B' and D-D' in FIG. 8C and FIG. 9C. FIG. 6C and FIG. 7C do not show the first interlayer insulating film, but the source wirings 151, 152, 154 and drain wirings 155, 156, 158 in the source and drain regions (not shown) of the insular semiconductor layers 104, 105, 107 are connected via contact holes formed in the first interlayer insulating film.

Figure 5:
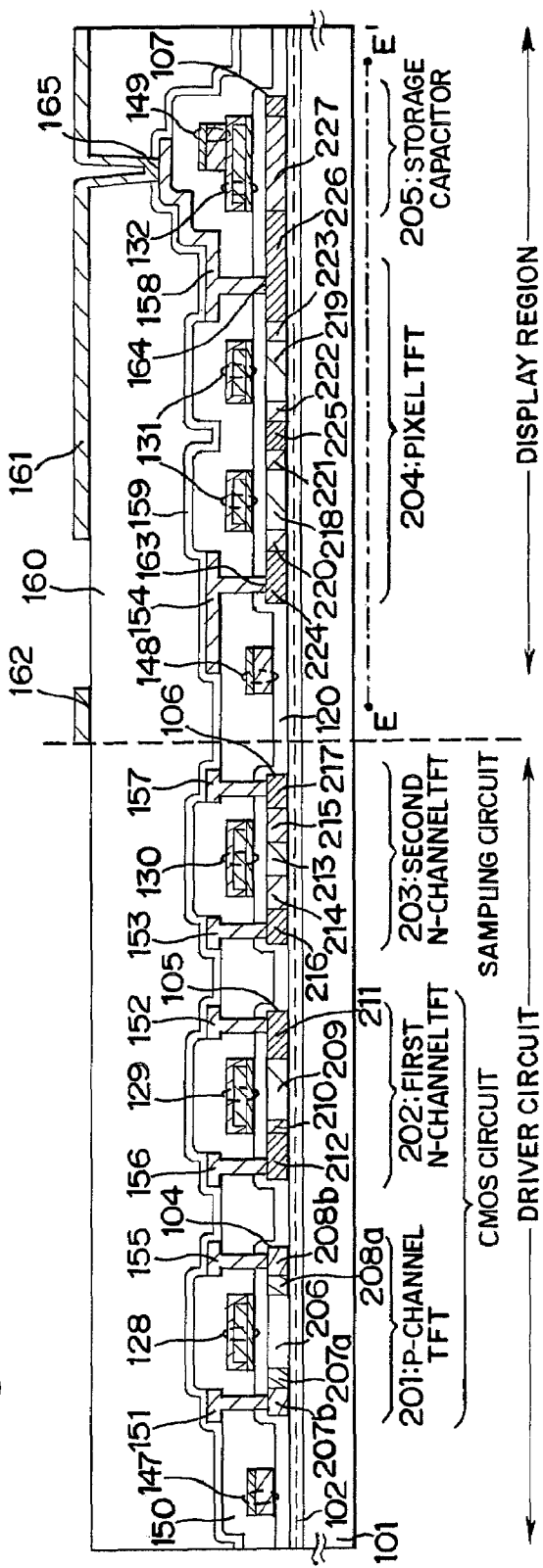
FIG. 5 is a cross-sectional view of a pixel TFT, a storage capacitor and a driver circuit TFT.

Next, a second interlayer insulating film 160 made of an organic resin is formed to a thickness of 1.0-1.5 μm. The organic resin used may be polyimide, acryl, polyamide, polyimideamide, BCB (benzocyclobutene) or the like. Here, after coating onto the substrate, a thermal polymerization type polyimide was used for formation by firing at 300° C. A contact hole reaching to the drain wiring 158 is then formed in the second interlayer insulating film 160, and pixel electrodes 161, 162 are formed. The pixel electrodes used may be of a transparent conductive film in the case of a transmitting liquid crystal display device, or of a metal film in the case of a reflective liquid crystal display device. In this embodiment a transmitting liquid crystal display device was used, and therefore an indium-tin oxide (ITO) film was formed by sputtering to a thickness of 100 nm (FIG. 5).

A substrate with a driver circuit TFT and a display region pixel TFT on the same substrate was completed in this manner. A p-channel TFT 201, a first n-channel TFT 202 and a second n-channel TFT 203 were formed on the driver circuit and a pixel TTFT 204 and a storage capacitor 205 were formed on the display region. Throughout the present specification, this substrate will be referred to as an active matrix substrate for convenience.

The p-channel TFT 201 of the driver circuit has a channel-forming region 206, source regions 207a, 207b and drain regions 208a, 208b in the insular semiconductor layer 104. The first n-channel TFT 202 has a channel-forming region 209, an LDD region 210 overlapping the gate electrode 129 (hereunder this type of LDD region will be referred to as L$_{ov}$), a source region 211 and a drain region 212 in the insular semiconductor layer 105. The length of this L$_{ov}$ region in the channel length direction was 0.5-3.0 μm, and is preferably 1.0-1.5 μm. The second n-channel TFT 203 has a channel-forming region 213, LDD regions 214, 215, a source region 216 and a drain region 217 in the insular semiconductor layer 106. These LDD regions are formed of an L$_{ov}$ region and an LDD region not overlapping the gate electrode 130 (hereunder this type of LDD region will be referred to as L$_{off}$), and the length of this L$_{off}$ region in the channel length direction is 0.3-2.0 μm, and preferably 0.5-1.5 μm. The pixel TFT 204 has channel-forming regions 218, 219, L$_{off}$ regions 220-223 and source or drain regions 224-226 in the insular semiconductor layer 107. The length of the L$_{off}$ regions in the channel length direction is 0.5-3.0 μm, and preferably 1.5-2.5 μm. The capacitor wirings 132, 149 and an insulating film made of the same material as the gate insulating film are connected to the drain region 226 of the pixel TFT 204, and a storage capacitor 205 is formed from an n-type impurity element-added semiconductor layer 227. In FIG. 5 the pixel TFT 204 has a double gate structure, but it may also have a single gate structure, and there is no problem with a multi-gate structure provided with multiple gate electrodes.

Thus, the present invention optimizes the structures of the TFTs of each circuit in accordance with the specifications required for the pixel TFT and driver circuit, thus allowing the operating performance and reliability of the semiconductor device to be improved. In addition, by forming the gate electrodes with a heat resistant conductive material, it is possible to facilitate activation of the LDD regions and source and drain regions, and thus adequately reduce wiring resistance by formation of the gate wirings with low resistance materials. This allows application to display devices having display regions (screen sizes) in the class of 4 inches or larger.

Embodiment Mode 2

Figure 16A:
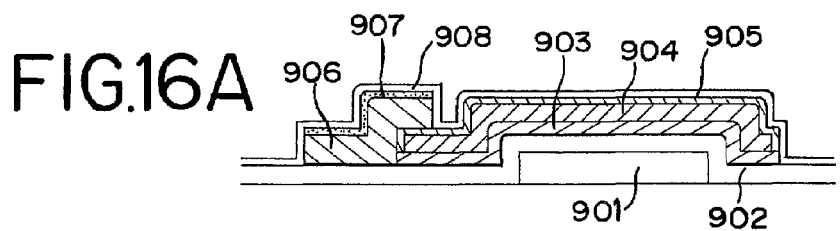
FIGS. 16A to 16C are sets of illustrations showing connections between gate electrodes and gate wirings.
Figure 16B:
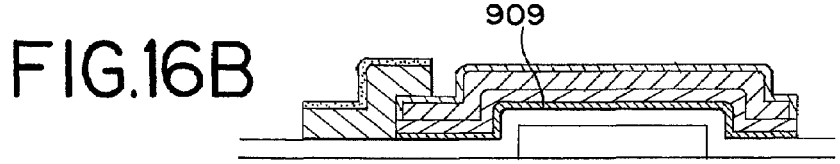
Figure 16C:
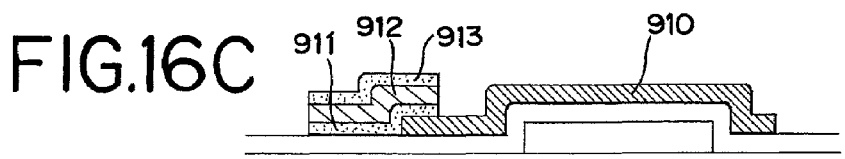

FIGS. 16A to 16C show other embodiments of gate electrodes and gate wirings. The gate electrodes and gate wirings in FIG. 16 are formed in the same manner as the steps indicated for Embodiment mode 1, and are formed over the insular semiconductor layer 901 and gate insulating film 902.

In FIG. 16A, the first conductive layer as the gate electrode is a conductive layer (A) 903 formed of tantalum nitride (TaN), tungsten nitride (WN), titanium nitride (TiN) or molybdenum nitride (MoN). The conductive layer (B) 904 is formed of an element selected from among tantalum (Ta), titanium (Ti), molybdenum (Mo) and tungsten (W), or an alloy composed mainly of the element or an alloy film comprising a combination of those elements, while a conductive layer (C) 905 is formed on the surface in the same manner as Embodiment mode 1. The conductive layer (A) 903 may be 10-50 nm (preferably 20-30 nm) and the conductive layer (B) 904 may be 200-400 nm (preferably 250-350 nm). The second conductive layer as the gate wiring is formed by laminating conductive layer (D) 906 composed mainly of aluminum (Al) or copper (Cu) as a low resistance material and conductive layer (E) 907 thereover formed of titanium (Ti) or tantalum (Ta). Because aluminum (Al) and copper (Cu) diffuse readily by stress migration or electromigration, the silicon nitride film 908 must be formed to a thickness of 50-150 nm so as to cover the second conductive layer.

FIG. 16B shows a gate electrode and gate wiring fabricated in the same manner as Embodiment mode 1, and a silicon film 909 doped with phosphorus (P) is formed under the gate electrode. The silicon film 909 doped with phosphorus (P) has the effect of preventing diffusion of trace alkali metal elements in the gate electrode into the gate insulating film, and is useful for the purpose of guaranteeing the reliability of the TFT.

FIG. 16C is an example of formation on the first conductive layer forming the gate electrode, with a silicon film 910 doped with phosphorus (P). The silicon film doped with phosphorus (P) is a higher resistance material than the other conductive metal material, but by forming the second conductive layer composing the gate wiring with aluminum (Al) or copper (Cu), it may be applied to large-area liquid crystal display devices. Here, the gate wiring may be made with a three-layer structure with formation of a Ti film 911 to 100 nm, a Ti-containing aluminum (Al) film 912 to 300 nm and a Ti film 913 to 150 nm, avoiding direct contact between the aluminum (Al) film and the phosphorus (P)-doped silicon film to provide heat resistance.

Embodiment Mode 3

Figure 15A:
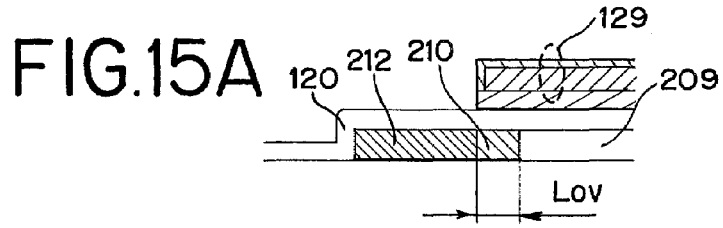
FIGS. 15A to 15 C are sets of illustrations showing positional relationships between gate electrodes and LDD regions.
Figure 15B:
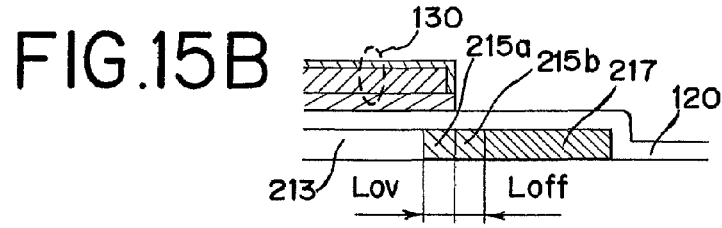
Figure 15C:
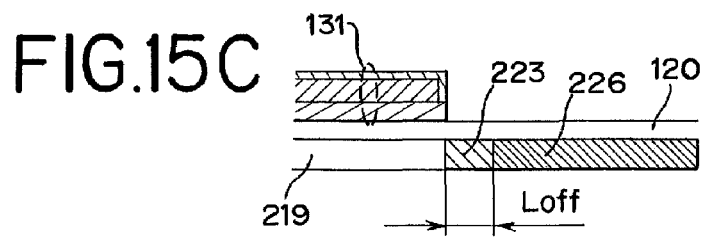

FIGS. 15A to 15C are illustrations of the structure of a TFT according to the invention, showing the positional relationship between the gate electrode and LDD region in a TFT having a semiconductor layer channel-forming region, an LDD region, a gate insulating film on the semiconductor layer and a gate electrode on the gate insulating film.

FIG. 15A shows a construction provided with a semiconductor layer having a channel-forming region 209, LDD region 210 and drain region 212, and a gate insulating film 120 and gate electrode 129 formed thereover. The LDD region 210 is an $L_{ov}$ provided overlapping the gate electrode 129 via the gate insulating film 120. The $L_{ov}$ has the function of attenuating the high electric field generated near the drain while preventing deterioration by hot carriers, and it can be suitably used in an n-channel TFT of a driver circuit comprising a shift register circuit, a level shifter circuit, a buffer circuit or the like.

FIG. 15B shows a construction provided with a semiconductor layer having a channel-forming region 213, LDD regions 215a, 215b and a drain region 217, and a gate insulating film 120 and gate electrode 130 formed on the semiconductor layer. The LDD region 215a is provided overlapping the gate electrode 130 via the gate insulating film 120. Also, the LDD region 215b is an $L_{off}$ provided without overlapping the gate electrode 130. The $L_{off}$ has the function of reducing the off-current value, and the structure provided with the $L_{ov}$ and $L_{off}$ can prevent deterioration by hot carriers while also reducing the off-current value, so that it may be suitably used in an n-channel TFT of the sampling circuit of a driver circuit.

FIG. 15C shows a semiconductor layer provided with a channel-forming region 219, an LDD region 223 and a drain region 226. The LDD region 223 is an $L_{off}$ provided without overlapping the gate electrode 131 via the gate insulating film 120, and it can effectively reduce the off-current value and is therefore suitable for use in a pixel TFT. The concentration of the n-type impurity element in the LDD region 223 of the pixel TFT is preferably from ½ to 1/10 less than the concentration in the LDD regions 210, 215 of the driver circuit.

Embodiment Mode 4

Figure 11:
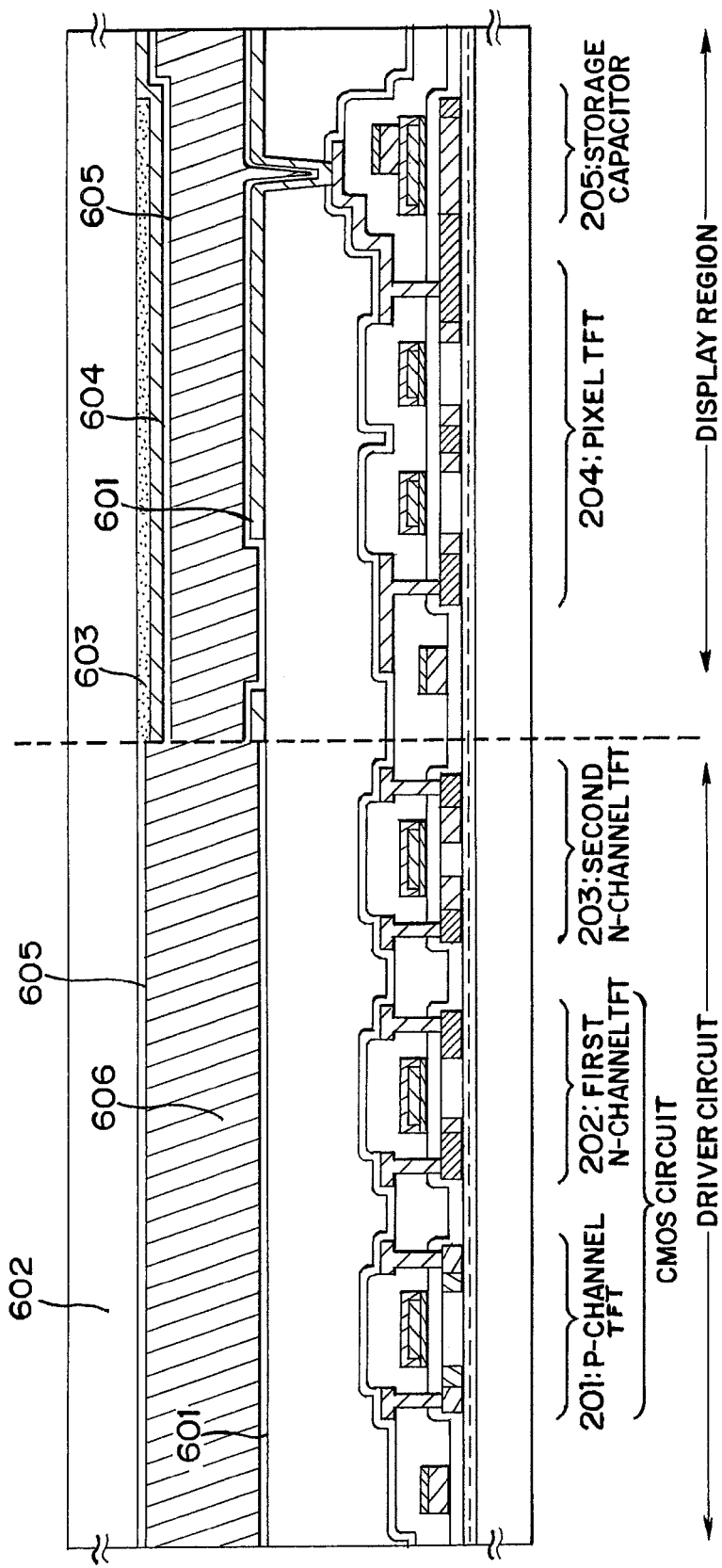
FIG. 11 is a cross-sectional view of the construction of a liquid crystal display device.

In this embodiment, the steps for fabricating an active matrix-type liquid crystal display device from an active matrix substrate will be explained. As shown in FIG. 11, an alignment film 601 is formed on an active matrix substrate in the state shown in FIG. 5 fabricated in Embodiment mode 1. A polyimide resin is often used as the alignment film for most liquid crystal display elements. On the opposing substrate 602 on the opposite side there are formed a light shielding film 603, a transparent conductive film 604 and an alignment film 605. After forming the alignment film, it is subjected to rubbing treatment so that the liquid crystal molecules are oriented with a consistent pretilt angle. The pixel matrix circuit and the substrate opposite the active matrix substrate on which the CMOS circuit has been formed are attached together through a sealing material or spacer (neither shown) by a publicly known cell joining step. Next, a liquid crystal material 606 is injected between both substrates and complete sealing is accomplished with a sealant (not shown). The liquid crystal material used may be any publicly known liquid crystal material. This completes the active matrix-type liquid crystal display device shown in FIG. 11.

The structure of this active matrix-type liquid crystal display device will now be explained with reference to the perspective view in FIG. 12 and the top view in FIG. 13. The same numerals are used in FIGS. 12 and 13 for correspondence with the cross-sectional structural diagrams of FIGS. 1 to 5 and FIG. 11. The cross-sectional structure along E-E' in FIG. 13 corresponds to the cross-sectional diagram of the pixel matrix circuit shown in FIG. 5.

Figure 12:
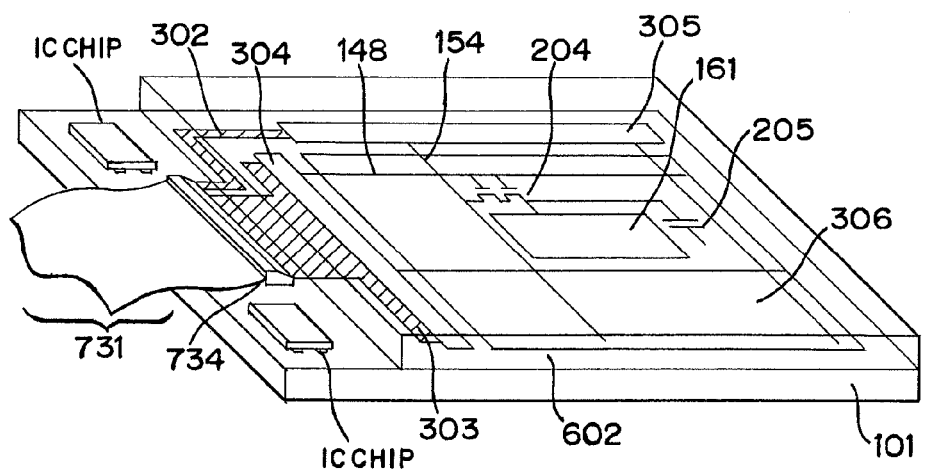
FIG. 12 is a perspective view of the construction of a liquid crystal display device.

In FIG. 12, the active matrix substrate is constructed of a display region 306, a scanning signal driver circuit 304 and an image signal driver circuit 305 formed on a glass substrate 101. A pixel TFT 204 is provided in the display region, and the driver circuit provided around it is constructed based on a CMOS circuit. The scanning signal driver circuit 304 and the image signal driver circuit 305 are each connected to the pixel TFT 204 with a gate wiring 148 and source wiring 154. Also, an FPC 731 is connected to an external I/O terminal 734 and is connected to each driver circuit with input wirings 302, 303.

Figure 13:
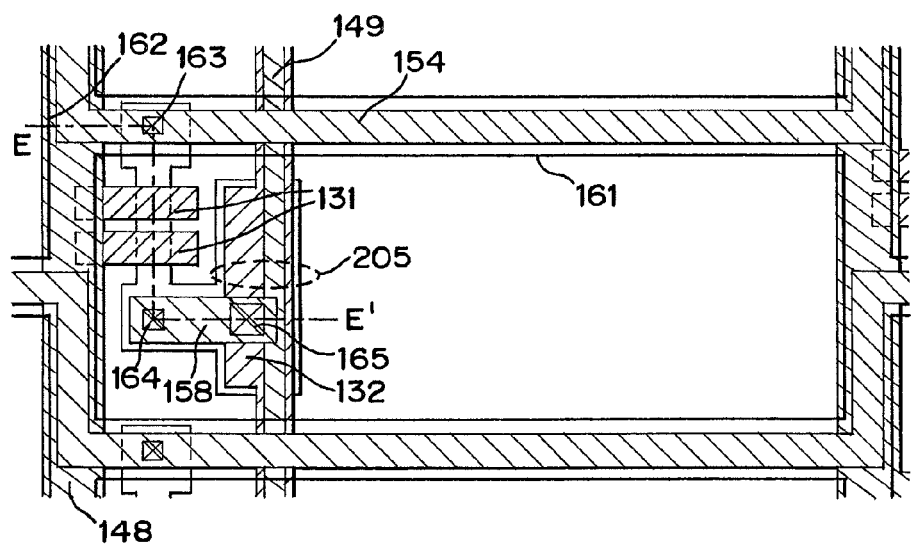
FIG. 13 is a top view of pixels in a display region.

FIG. 13 is a top view showing about one pixel portion of the display region 306. The gate wiring 148 crosses with a semiconductor layer 107 under it via a gate insulating film (not shown). Also not shown on the semiconductor layer are a source region, drain region and an $L_{off}$ region as an n⁻ region. A connector 163 is present between the source wiring 154 and the source region 224, a connector 164 is present between the drain wiring 158 and the drain region 226, and a connector 165 is present between the drain wiring 158 and the pixel electrode 161. A storage capacitor 205 is formed in the region where the semiconductor layer 227 extending from the drain region 226 of the pixel TFT 204 overlaps with the capacitor wirings 132, 149 via a gate electrode film.

The active matrix-type liquid crystal display device of this embodiment was explained with the structure of Embodiment mode 1, but an active matrix-type liquid crystal display device may also be fabricated using any combination with the =construction of Embodiment mode 2.

Embodiment Mode 5

Figure 10:
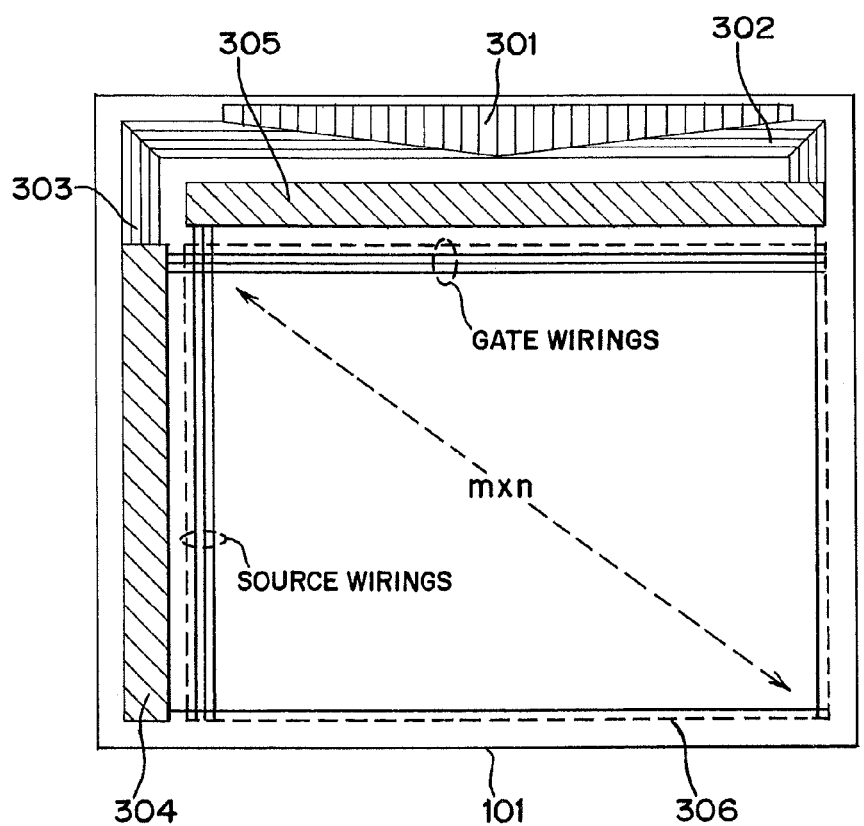
FIG. 10 is a top view of the I/O terminal and wiring circuit layout of a liquid crystal display device.

FIG. 10 is an illustration showing the arrangement of the I/O terminal, display region and driver circuit of a liquid crystal display device. The display region 306 has m gate wirings and n source wirings crossing in a matrix fashion. For example, when the pixel density is VGA (Video Graphics Array), 480 gate wirings and 640 source wirings are formed, and for XGA (eXtended Graphics Array) 768 gate wirings and 1024 source wirings are formed. The screen size of the display region has a diagonal length of 340 mm in the case of a 13-inch class display, and 460 mm in the case of an 18-inch class display. In order to realize such a liquid crystal display device it is necessary to form the gate wirings with a low resistance material as indicated for Embodiment mode 1 and Embodiment mode 2.

A scanning signal driver circuit 304 and an image signal driver circuit 305 are provided around the display region 306. Since the lengths of these driver circuit gate wirings are also necessarily longer with increasing size of the screen of the display region, they are preferably formed of a low resistance material as indicated for Embodiment mode 1 and Embodiment mode 2, in order to realize large-sized screens.

According to the invention, the input wirings 302, 303 connecting from the input terminal 301 to each driver circuit may be formed of the same material as the gate wirings, and they can contribute to the lower wiring resistance.

Embodiment Mode 6

Figure 14:
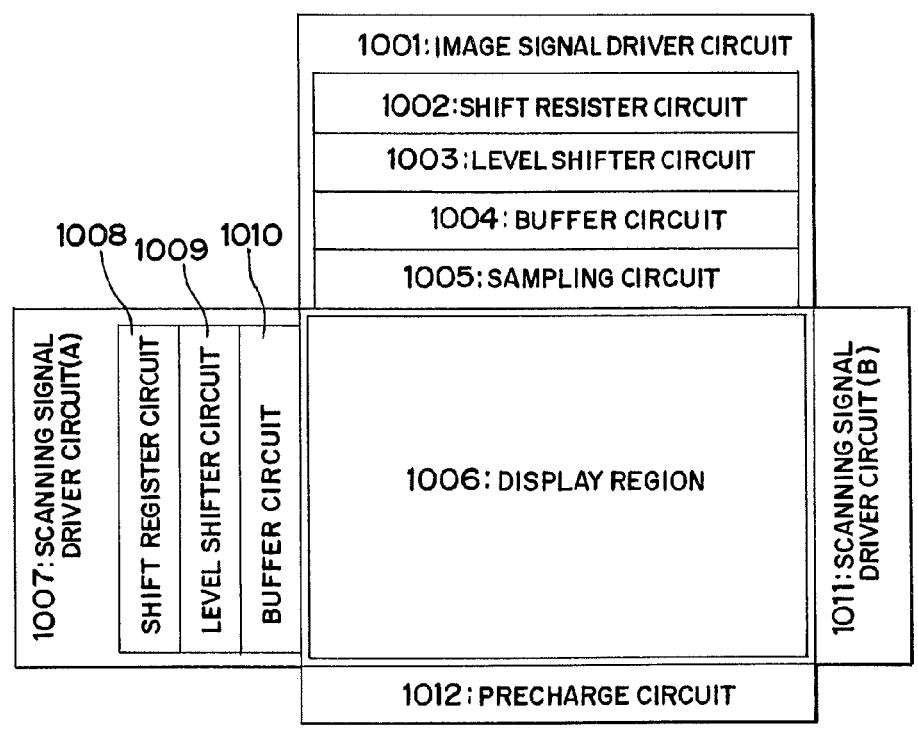
FIG. 14 is a circuit block diagram for a liquid crystal display device.

FIG. 14 is an illustration of the construction of the active matrix substrate shown in Embodiment mode 1 or Embodiment mode 2, for a direct-view display device circuit construction. The active matrix substrate of this embodiment has an image signal driver circuit 1001, a scanning signal driver circuit (A) 1007, a scanning signal driver circuit (B) 1011, a precharge circuit 1012 and a display region 1006. Throughout this specification, the term "driver circuit" will include the image signal driver circuit 1001 and the scanning signal driver circuit (A) 1007.

The image signal driver circuit 1001 is provided with a shift register circuit 1002, a level shifter circuit 1003, a buffer circuit 1004 and a sampling circuit 1005. The scanning signal driver circuit (A) 1007 is provided with a shift register circuit 1008, a level shifter circuit 1009 and a buffer circuit 1010. The scanning signal driver circuit (B) 1011 also has the same construction.

The shift register circuits 1002, 1008 have a driving voltage of 5-16 V (typically 10 V), and the n-channel TFT of the CMOS circuit forming this circuit suitably has the construction shown as 202 in FIG. 5. The level shifter circuits 1003, 1009 and buffer circuits 1004, 1010 have a driving voltage as high as 14-16 V, and a CMOS circuit including the n-channel TFT 202 in FIG. 5 is suitable, as for the shift register circuit. In these circuits, formation of the gates with a multi-gate structure is effective for raising the voltage resistance and improving the circuit reliability.

The sampling circuit 1005 has a driving voltage of 14-16 V, but since it is necessary to reduce the off-current value while driving is effected with an alternating reverse polarity, a CMOS circuit containing the n-channel TFT 203 in FIG. 5 is suitable. FIG. 5 shows only an n-channel TFT, but in an actual sampling circuit it is formed in combination with a p-channel TFT. Here, the p-channel TFT is adequate with the construction shown by 201 in the same drawing.

The pixel TFT 204 has a driving voltage of 14-16 V, and from the standpoint of reduced power consumption, a further reduction in the off-current value compared to the sampling circuit is required, and therefore the structure preferably has an LDD ($L_{off}$) region provided without overlapping of the gate electrodes in the manner of the pixel TFT 204.

The construction of this embodiment may be easily realized by fabricating the TFT according to the steps indicated for Embodiment mode 1. In this embodiment there is only shown the construction for the display region and the driver circuit, but by following the steps for Embodiment mode 1 it is possible to form a signal processing circuit such as a signal splitting circuit, sub-harmonic circuit, D/A converter, γ-correction circuit, operational amplifier circuit, memory circuit or computational processing circuit, or a logic circuit, on the same substrate. Thus, the present invention can realize a semiconductor device comprising a pixel matrix circuit and its driver circuit on the same substrate, for example, a semiconductor device equipped with a signal driver circuit and a pixel matrix circuit.

Embodiment Mode 7

An active matrix substrate and liquid crystal display device fabricated according to the present invention may be used for a variety of electro-optical devices. The invention may also be applied to any electronic instrument incorporating such an electro-optical device as a display medium. As electronic instruments there may be mentioned personal computers, digital cameras, video cameras, portable information terminals (mobile computers, cellular phones, electronic books, etc.), navigation systems, and the like. An example of one of these is shown in FIGS. 17A to 17E.

Figure 17A:
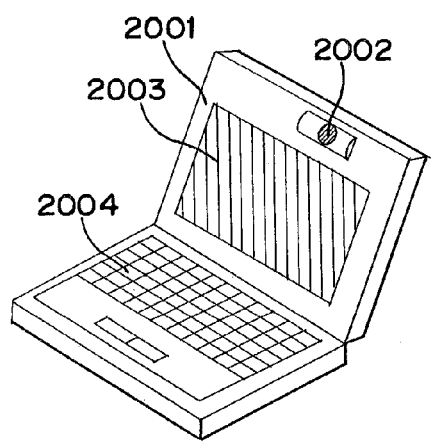
FIGS. 17A to 17E are sets of illustrations showing examples of semiconductor devices.

FIG. 17A is a personal computer, which is constructed with a main body 2001 provided with a microprocessor or memory, an image input device 2002, a display device 2003 and a keyboard 2004. According to the invention, the display device 2003 or another signal processing circuit may be formed.

Figure 17B:
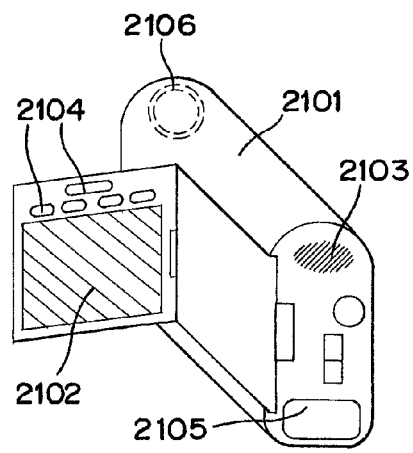

FIG. 17B is a video camera, which is constructed with a main body 2101, a display device 2102, a voice input device 2103, an operating switch 2104, a battery 2105 and an image receiving device 2106. The invention may be applied to the display device 2102 or to another signal driver circuit.

Figure 17C:
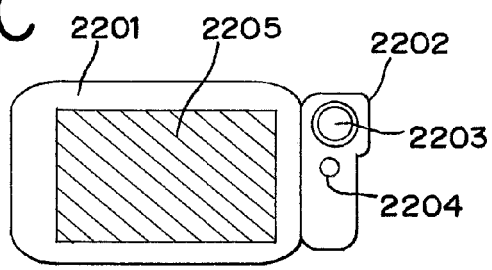

FIG. 17C is a portable data terminal, which is constructed with a main body 2201, an image input device 2202, an image receiving device 2203, an operating switch 2204 and a display device 2205. The invention may be applied to the display device 2205 or to another signal driver circuit.

Figure 17D:
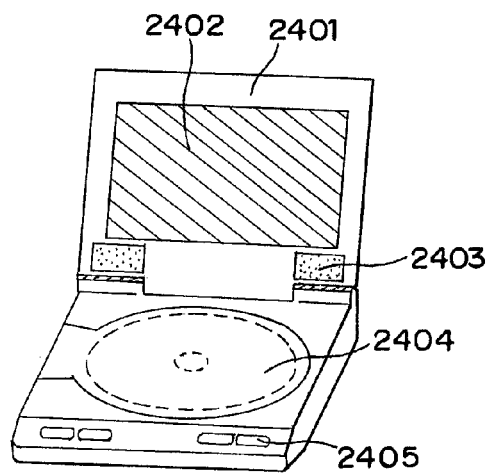

FIG. 17D is a player used for program-recorded recording media (hereunder referred to simply as recording media), and it is constructed with a main body 2401, a display device 2402, a speaker 2403, a recording medium 2404 and an operating switch 2405. The recording medium used may be a DVD (Digital Versatile Disc) or compact disc (CD), and this allows music program reproduction and image display, as well as display of data for video games (or TV games) and through the internet. The invention may satisfactorily employ the display device 2402 or another signal driver circuit.

Figure 17E:
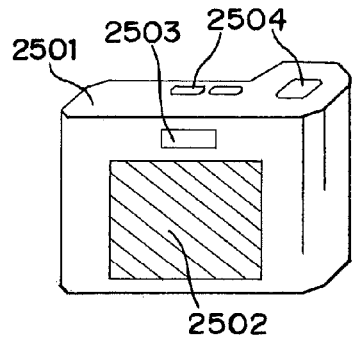

FIG. 17E is a digital camera, which is constructed with a main body 2501, a display device 2502, an eyepiece 2503, an operating switch 2504 and an image receiver (not shown). The invention may be applied to the image device 2502 or to another signal driver circuit.

Thus, the scope of the present invention is very wide and it can be applied to electronic instruments in a variety of fields. The electronic instruments for these embodiments can also be realized using constructions with any combination of Embodiment modes 1 to 6.

Embodiment Mode 8

Figure 18A:
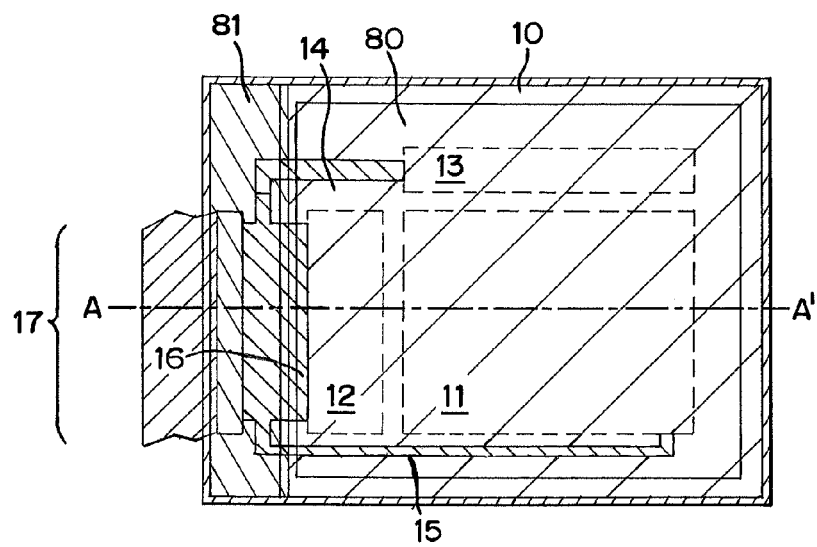
FIGS. 18A and 18B are a top view and a cross sectional view of an EL display device, respectively.

An example of manufacturing a spontaneous light emitting type display panel using electro-luminescence (EL) material (hereinafter referred to as EL display device) from an active matrix substrate similar to that of Embodiment mode 1 is described in the present embodiment mode. FIG. 18A shows a top view of the EL display panel. In FIG. 18A, reference numeral 10 is a substrate, 11 is a pixel section, 12 is a source side driver circuit, and 13 is a gate side driver circuit; each driver circuit reaches a FPC 17 through wirings 14 to 16, and then connected to the external devices.

Figure 18B:
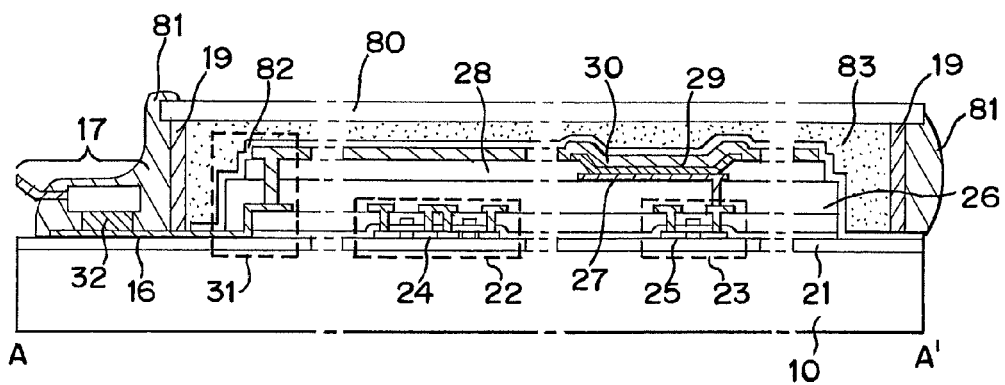

FIG. 18B shows a cross section corresponding at line A-A' of FIG. 18A. Here an opposite plate 80 is disposed over at least the pixel section, preferably over driver circuit and pixel section. Opposite plate 80 is stuck by a sealing material 19 to an active matrix substrate on which TFTs and spontaneous light emitting layer using EL material are formed. Filler (not shown in the Figure) is mixed into the sealing material 19 and the two substrates are stuck together to have an approximately uniform distance by this filler. Further the device has a structure to seal tight with sealant 81 on the outside of sealing material 19 and the top and the peripheral of FPC 17. Sealant 81 uses a material such as silicone resin, epoxy resin, phenol resin, or butyl rubber, etc.

A space is formed in the inside when the active matrix substrate 10 and the opposite substrate 80 are stuck together by the sealing material 19. Fillings 83 are filled in the space. This fillings 83 also has an effect of adhering the opposite plate 80. PVC (poly vinyl chloride), epoxy resin, silicone resin, PVB (poly vinyl butyral) or EVA (ethylene vinyl acetate) can be used as the fillings 83. Because the spontaneous light emitting layer is weak against moisture and easy to deteriorate, it is preferable to form on the inside of the fillings 83 a drying agent such as barium oxide so that moisture absorption effect can be maintained. Further the device is structured to form a passivation film 82 over the spontaneous light emitting layer from silicon nitride film or silicon nitride oxide film etc. so that corrosion by alkali elements etc. included in the fillings 83 is prevented.

A glass plate, an aluminum plate, a stainless steel plate, an FRP (fiberglass-reinforced plastic) plate, a PVF (poly vinyl fluoride) film, a Myler film (a trademark of I.E. du Pont de Nemours and Company), a polyester film, an acrylic film or an acrylic plate can be used for the opposite plate 80. Further, moisture resistance can be increased by using a sheet which has a structure of sandwiching an aluminum foil of several tens μm with PVF film or Myler Film™. In this way, EL elements are tightly sealed and shielded from the outer atmosphere.

In FIG. 18B, driver circuit TFI 22 (note that a CMOS circuit combining n-channel TFT and p-channel TFT is shown in the Figure) and TFT for pixel section 23 (note that TFT which controls electric current to an EL element is shown here) are formed over a substrate 10 and base film 21. Specifically, among these TFTs the n-channel TFT are provided with the LDD region having a structure shown in the present embodiment mode to prevent reduction of ON current due to hot carrier effect and characteristic deterioration due to Vth shift or bias stress.

For instance, p-channel TFT 201 and n-channel TFT 202 shown in FIG. 5 may be used for driver circuit TFT 22. Though it depends on the driving voltage, if the driver voltage is 10V or greater, the first n-channel TFT 204 of FIG. 5 or a p-channel TFT having the similar structure may be used for pixel section TFT. While the first n-channel TFT 202 is structured to dispose an LDD that overlaps with a gate electrode on the drain side, it is not necessarily disposed when the driving voltage is smaller than 10V because deterioration of TFT due to hot carrier effect can be almost neglected.

In order to fabricate an EL display device from an active matrix substrate in the state of FIGS. 1A to 1D, an interlayer insulating film (flattening film) 26 comprising a resin material is formed over the source wiring and the drain wiring, and a pixel electrode 27 comprising a transparent conductive film which is electrically connected to drain of pixel section TFT 23 is formed thereon. A compound of indium oxide and tin oxide (referred to as ITO) or a compound of indium oxide and zinc oxide can be used for the transparent conductive film. After forming the pixel electrode 27, an insulating film 28 is formed, and an opening section is formed over a pixel electrode 27.

Next, a spontaneous light emitting layer 29 is formed. The spontaneous light emitting layer 29 may be a laminate structure or a single layer structure, in which publicly known EL materials (hole injection layer, hole transport layer, light emitting layer, electron transport layer or electron injection layer) may be freely combined. A technique of public domain may be utilized regarding how it is structured. Further, there are small molecular materials and polymer materials for the EL material. Evaporation method is used in case of using a small molecular material, and a simple method such as spin coating, printing or ink jet method etc can be used in case of using a polymer material.

The spontaneous light emitting layer may be formed by an evaporation method utilizing a shadow mask, or ink jet method or dispenser method. In either way, a colored display is possible by forming luminescent layers capable of emitting light of different wavelength per pixel (red light emitting layer, green light emitting layer and blue light emitting layer). Any other form may be used, such as combining color changing layers (CCM) with color filters, and combining white light emitting layers with color filters. Needless to say, a single color emitting EL display device is also possible.

After forming the spontaneous light emitting layer 29, a cathode 30 is formed on top. It is preferable to remove as much as possible of the moisture and oxygen existing in the interface between the cathode 30 and spontaneous light emitting layer 29. It is therefore necessary to take measures such as forming the spontaneous light emitting layer 29 and cathode 30 inside a vacuum by successive film deposition, or forming the spontaneous light emitting layer 29 in an inert atmosphere and then forming the cathode 30 without exposure to the atmosphere. It is possible to perform the above film deposition in the present embodiment by using a multi-chamber system (cluster tool system) deposition device.

Note that a laminate structure of a LiF (lithium fluoride) film and an Al (aluminum) film is used for the cathode 30 in Embodiment mode 8. Specifically, a 1 nm thick LiF (lithium fluoride) film is formed on the spontaneous light emitting layer 29 by evaporation, and a 300 nm thick aluminum film is formed on top of that. Needless to say, a MgAg electrode, a known cathode material, may be used. The cathode 30 is connected to the wiring 16 in the region denoted with the reference numeral 31. The wiring 16 is a power supply line in order to supply a preset voltage to the cathode 30, and is connected to the FPC 17 through an anisotropic conductive paste material 32. A resin layer 80 is further formed on FPC 17, and adhesive strength in this section is increased.

In order to electrically connect the cathode 30 and the wiring 16 in the region denoted as reference numeral 31, it is necessary to form a contact hole in the interlayer insulating film 26 and the insulating film 28. The contact hole may be formed during etching of the interlayer insulating film 26 (when forming the pixel electrode contact hole) and during etching of the insulating film 28 (when forming the open section before forming the spontaneous light emitting layer). Further, etching may proceed in one shot all the way to the interlayer insulating film 26 when etching the insulating film 28. In this case the contact holes can have a good shape provided that the interlayer insulating film 26 and the insulating film 28 are the same resin material.

The wiring 16 is electrically connected to FPC 17 by passing through a space between sealing material 19 and substrate 10 (provided it is closed by sealant 81). Note that the explanation is made here in regard to wiring 16, but other wirings 14 and 15 are also electrically connected to FPC 17 passing through underneath the sealing material 18 in the similar way.

Figure 20A:
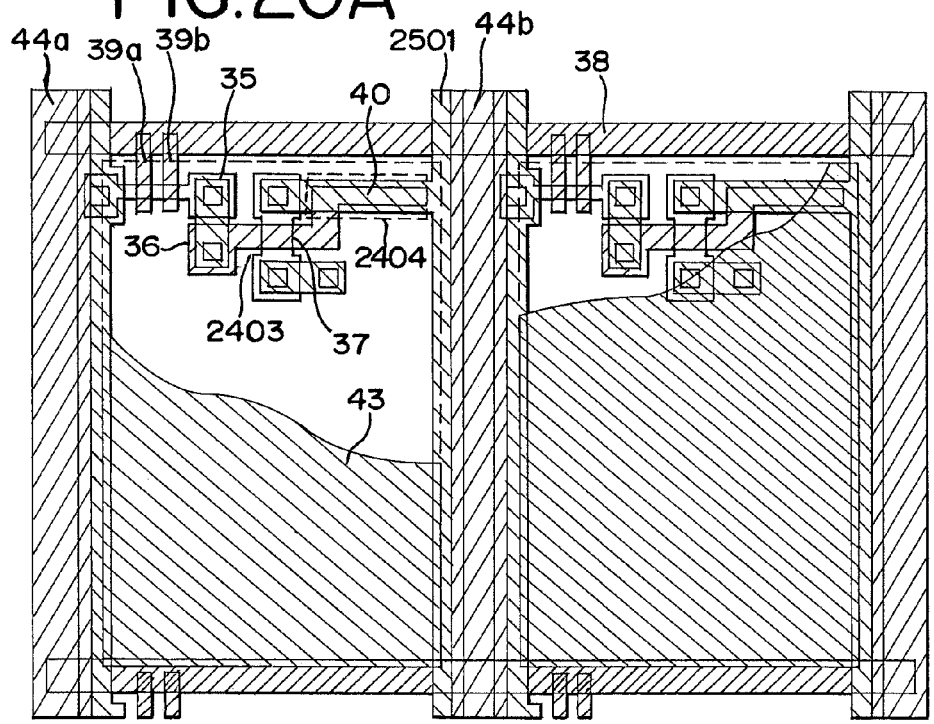
FIGS. 20A and 20B are a top view and a circuit diagram of a pixel portion of an EL display device.
Figure 20B:
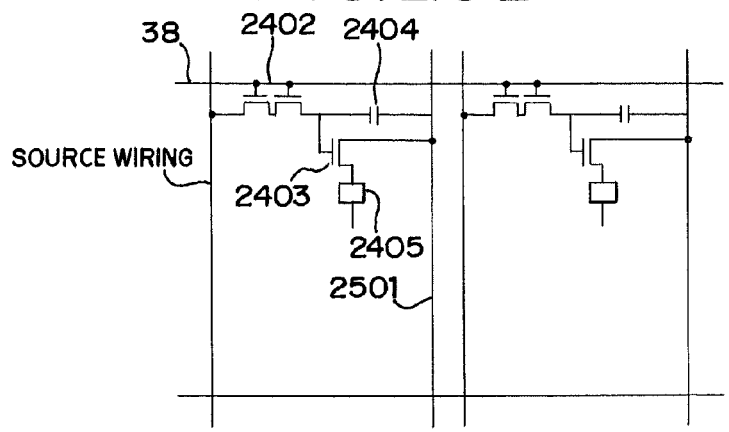

A more detailed cross sectional structure of the pixel section are shown here in FIGS. 19A and 19B, top view is shown in FIG. 20A and the circuit diagram is shown in FIG. 20B. In FIG. 19A, switching TFT 2402 provided on the substrate 2401 is formed in the same structure as pixel TFT 204 of FIG. 5 of Embodiment mode 1. It becomes a structure in which 2 TFTs are connected in series by adopting double gate structure, and OFF current value can be reduced by forming LDD in offset region disposed not to overlap with the gate electrode. While the present embodiment uses a double gate structure, the structure may be a triple gate structure or a multi-gate structure having greater number of gates.

Further, a current control TFT 2403 is formed by using the first n-channel TFT 202 shown in FIG. 5. This TFT structure is a structure in which LDD that overlaps with gate electrode is disposed only on the drain side, and that increases electric current driver capacity by reducing parasitic capacitance and series resistance between gate and drain. Also from other point of view, application of such a structure has a very important meaning. Because current control TFT is an element for controlling electric current amount that flow in the EL element, it is an element which has a higher risk of deterioration due to heat and of deterioration due to hot carriers, by flow of a lot of electric current. Deterioration of the current control TFT can be prevented, and the operation stability can be increased, by providing an LDD region that partly overlaps with a gate electrode. In this case, drain wiring 35 of switching TFT 2402 is electrically connected to gate electrode 37 of current control TFT through wiring 36. The wiring denoted as reference numeral 38 is a gate wiring that electrically connects gate electrodes 39a and 39b of switching TFT 2402.

Further, while the present embodiment shows a single gate structure for the electric current TFT 2403, it may be a multi-gate structure connecting a plurality of TFTs in series. Moreover, it may be a structure in which a plurality of TFTs are connected in parallel dividing the channel forming region in effect, and in which the heat emission is available with high efficiency. Such structure is effective as a counter measure for deterioration due to heat.

As shown in FIG. 20A, the wiring which becomes the gate electrode 37 of current control TFT 2403 overlaps with the drain wiring 40 of current control TFT 2403 by interposing an insulating film in the region denoted as reference numeral 2404. A capacitor is formed here in the region denoted as reference numeral 2404. This capacitor 2404 functions as a capacitor to hold voltage applied to the gate of current control TFT 2403. The drain wiring 40 is connected to current supply line (power source supply line) 2501 and a constant voltage is always applied thereto.

A first passivation film 41 is formed over the switching TFT 2402 and current control TFT 2403, and a planarization film 42 comprising a resin insulating film is formed thereon. It is very important to flatten the level difference due to the TFT by using the planarization film 42. A spontaneous light emitting layer to be formed later is so thin that the presence of the level difference may sometimes cause trouble in emitting light. Therefore flattening is desirably carried out before forming a pixel electrode in order to form the spontaneous light emitting layer on the surface as flat as possible.

Denoted by 43 is a pixel electrode (cathode of the EL element) made of a conductive film with high reflectivity, which is electrically connected to the drain of the current controlling TFT 2403. Preferable material for the pixel electrode 43 is a low resistance conductive film such as an aluminum alloy film, a copper alloy film and a silver alloy film, or a lamination film of those films. Needless to say, those films may be used to form a lamination structure with other conductive films. Banks 44a and 44b made of an insulating film (preferably resin) form a groove (corresponding to pixel) therebetween to form a light emitting layer 44 in the groove. Though only one pixel is shown here, light emitting layers corresponding to the colors R (red), G (green) and B (blue), respectively, may be formed. As an organic EL material for forming the light emitting layer, π conjugate polymer material is used. Representative polymer materials include a polyparaphenylene vinylene (PPV)-, polyvinyl carbazole (PVK)-, and polyfluore-based materials, etc. Among PPV-based organic EL materials of various forms, usable material is one disclosed in, for example, H. Shenk, H. Becker, O. Gelsen, E. Kluge, W. Kreuder, and H. Spreitzer, "Polymers for Light Emitting Diodes," Euro Display, Proceedings, 1999, pp. 33-37, or in Japanese Patent Application Laid-Open No. Hei 10-92576.

Specifically, cyanopolyphenylene vinylene is used for the light emitting layer for emitting red light, polyphenylene vinylene is used for the light emitting layer for emitting green light, and polyphenylene vinylene or polyalkylphenylene is used for the light emitting layer for emitting blue light. Appropriate film thickness thereof is 30 to 150 nm (preferably 40 to 100 nm). However, the description above is an example of an organic EL material usable as the light emitting layer and there is no need to limit the present invention thereto. The spontaneous light emitting layer (a layer for emitting light and for moving carriers to emit light) may be formed by freely combining the light emitting layer, electric charge transport layer and an electric charge injection layer. Instead of the polymer material that is used as the light emitting layer in the example shown in this embodiment, for instance, a small molecular organic EL material may be used. It is also possible to use an inorganic material such as silicon carbide for the electric charge transport layer and the electric charge injection layer. Known materials can be used for these organic EL materials and inorganic materials.

The spontaneous light emitting layer in this embodiment has a lamination structure in which a hole injection layer 46 comprising PEDOT (polytiophene) or PAni (polyaniline) is layered on the light emitting layer 45. In the case of this embodiment, light produced in the light emitting layer 45 is emitted toward the top face (upwards beyond the TFTs), which requires an anode having light transmissivity. The transparent conductive film may be formed from a compound of indium oxide and tin oxide or a compound of indium oxide and zinc oxide, and preferred material is one that can be formed into a film at a temperature as low as possible because the transparent conductive film is formed after forming the light emitting layer and the hole injection layer which have low heat resistance.

A spontaneous light emitting element 2045 is completed upon formation of the anode 47. The spontaneous light emitting element 2045 here refers to a capacitor consisting of the pixel electrode (cathode) 43, the light emitting layer 45, the hole injection layer 46 and the anode 47. As shown in FIG. 20A, the pixel electrode 43 extends almost all over the area of the pixel, so that the entire pixel functions as the spontaneous light emitting element. Therefore light emitting efficiency is very high, resulting in bright image display.

In this embodiment, a second passivation film 48 is further formed on the anode 47. Preferred second passivation film 48 is a silicon nitride film or a silicon nitride oxide film. A purpose of this second passivation film is to shut the spontaneous light emitting element from the external with the intention of preventing degradation of the organic EL material due to oxidation as well as suppressing degassing from the organic EL material. This enhances reliability of the EL display device.

As described above, the EL display panel of this embodiment includes the pixel section comprising pixels that has the structure as shown in FIG. 20A, the switching TFT with sufficiently low OFF current value, and the current controlling TFT which is strong against hot carrier injection. Thus obtained is the EL display panel that has high reliability and is capable of excellent image display.

FIG. 19B shows an example of inverting the structure of spontaneous light emitting layer. The current control TFT 2601 is formed by the same structure as p-channel TFT 201 of FIG. 5. Embodiment mode 1 may be referred regarding the fabrication method. A transparent conductive film is used as the pixel electrode (anode) 50 in this embodiment. Specifically, a conductive film made from a compound of indium oxide and zinc oxide is used. Needless to say, a conductive film made from a compound of indium oxide and tin oxide may be used too.

After forming banks 51a and 51b made of an insulating film are formed, a light emitting layer 52 comprising polyvinyl carbazole is formed by applying a solution. An electron injection layer 53 comprising potassium acetylacetonate (denoted as acacK) and a cathode 54 made of an aluminum alloy are formed thereon. In this case, the cathode 54 functions also as a passivation film. An EL element 2602 is thus formed. In this embodiment, light produced in the light emitting layer 52 is emitted, as indicated by the arrow in the drawing, toward the substrate on which TFTs are formed. It is preferable to form the current control TFT 2601 by p-channel TFT in case of applying the structure of the present example.

The EL display device shown in this embodiment can be utilized as a display section of electronic devices of Embodiment mode 7.

Embodiment Mode 9

Figure 21A:
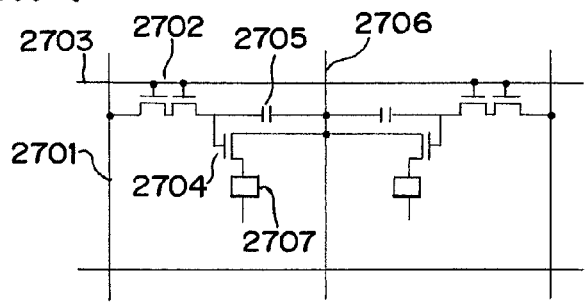
FIGS. 21A to 21C are circuit diagrams of a pixel portion of an EL display device.
Figure 21B:
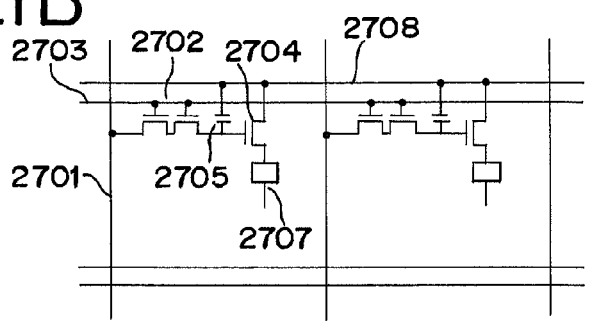
Figure 21C:
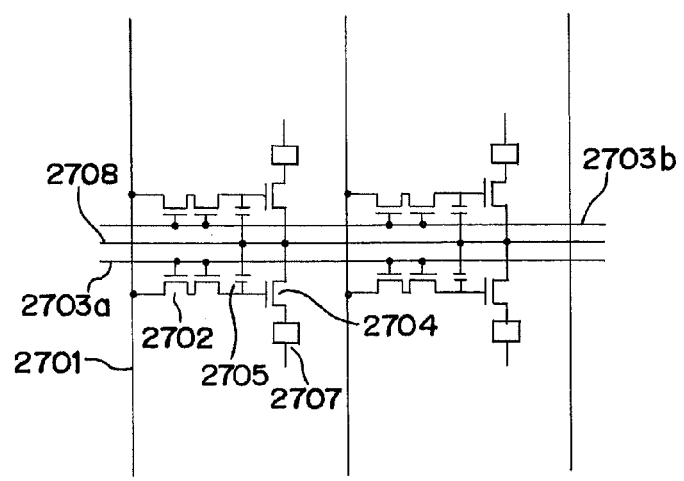

This embodiment shows in FIGS. 21A to 21C, examples where a pixel has a different structure from the one shown in the circuit diagram of FIG. 20B. In this embodiment, reference numeral 2701 denotes a source wiring of a switching TFT 2702; 2703, gate wirings of the switching TFT 2702; 2704, a current controlling TFT; 2705, a capacitor; 2706 and 2708, electric current supply line; and 2707, an EL element.

FIG. 21A shows an example in which the current supply line 2706 is shared by two pixels. In other words, this example is characterized in that two pixels are formed so as to be axisymmetric with respect to the current supply line 2706. In this case, the number of current supply lines can be reduced, further enhancing the definition of the pixel section.

FIG. 21B shows an example in which the current supply line 2708 is arranged in parallel with the gate wirings 2703. Though the current supply line is arranged so as not to overlap with the gate wirings 2703 in FIG. 21B, the two may overlap with each other through an insulating film if the lines are formed in different layers. In this case, the current supply line 2708 and the gate wirings 2703 can share their occupying area, further enhancing the definition of the pixel section.

An example shown in FIG. 21C is characterized in that the current supply line 2708 is arranged, similar to the structure in FIG. 21B, in parallel with the gate wirings 2703 and, further, two pixels are formed to be axisymmetric with respect to the current supply line 2708. It is also effective to arrange the current supply line 2708 so as to overlap with one of the gate wirings 2703. In this case, the number of current supply lines can be reduced, further enhancing the definition of the pixel section. Though a capacitor 2705 is provided in order to hold voltage applied onto the gate of current control TFT 2704 in FIGS. 21A and 21B, it is possible to omit capacitor 2705.

Because n-channel TFT of the present invention as shown in FIG. 19A is used as the current control TFT 2704, it has an LDD region provided to overlap with the gate electrode by interposing a gate insulating film. In general a parasitic capacitance called a gate capacitance is formed in this overlapped region, and the present embodiment is characterized in that it uses the parasitic capacitance in place of a capacitor 2705. Because the capacitance of this parasitic capacitance varies by the overlapped area of the gate electrode and the LDD region, it is determined by the length of the LDD region included in the overlapped region. Further, it is possible to omit capacitor 2705 in the structures of FIGS. 21A to 21C, similarly.

Note that the circuit structure of an EL display device shown in the present embodiment mode may be selected from the structure of TFTs shown in Embodiment mode 1 to form a circuit shown in FIGS. 21A to 21C. It is possible to use an EL display panel of the present embodiment as a display section of the electronic devices of Embodiment mode 7.

EMBODIMENTS

Embodiment 1

As shown in Embodiment mode 1, the gate electrode and the gate wiring of a TFT contact at the outside of an island semiconductor layer without interposing a contact hole. The results of evaluating the resistance of the gate electrode and the gate wiring in such structure, are shown in Tables 1 and 2. Table 1 shows sheet resistance of materials that form the gate electrode and the gate wiring.

TABLE 1 various sheet resistances of metals for gate and gate bus line

| metallic material | Film thickness (Å) | sheet resistance (Ω/□) |
|---|---|---|
| TaN\Ta | 500\3500 | 1.58 |
| W | 4000 | 0.36 |
| Al—Nd | 2500 | 0.19 |
| TaN\Ta\Al—Nd | 500\3500\2500 | 0.16 |
| W\Al—Nd | 4000\2500 | 0.12 |

Table 2 shows the results of calculating contact resistance per contact section from the measured value from a contact chain (number of contacts 100 to 200), which was fabricated in order to evaluate the contact resistance of the gate electrode and the gate wiring. The area of each contact section is set at 4 μm×10 μm or 6 μm×10 μm.

TABLE 2 contact resistances per contact chain between gate metal and gate bus line

| mask design value | TaN\Ta gate electrode | | W gate electrode | |
|---|---|---|---|---|
| (width × length × number of contact) | resistance (Ω) | resistance (Ω) | resistance (Ω) | resistance (Ω) |
| 4 μm × 10 μm × 100 | 162.7 | 158.5 | 0.09 | 0.08 |
| 4 μm × 10 μm × 200 | 162.2 | 156.4 | 0.06 | 0.06 |
| 6 μm × 10 μm × 100 | 183.7 | 175.1 | 0.05 | 0.05 |
| 6 μm × 10 μm × 200 | 172.0 | 168.3 | 0.04 | 0.04 |

For the gate electrode, 2 kinds of films, namely, a laminate film of TaN film and Ta film, and a W film were fabricated. Gate wiring was formed from Al. Note that Nd is added 1% by weight to the Al. (Hereinafter denoted as Al—Nd film.) When the overlapped area of the gate electrode and gate wiring is presumed to be 40 μm$^2$, the contact resistance was approximately 200Ω for the laminate film of TaN film and Ta film, and approximately 0.1Ω for the W film.

Figure 22:
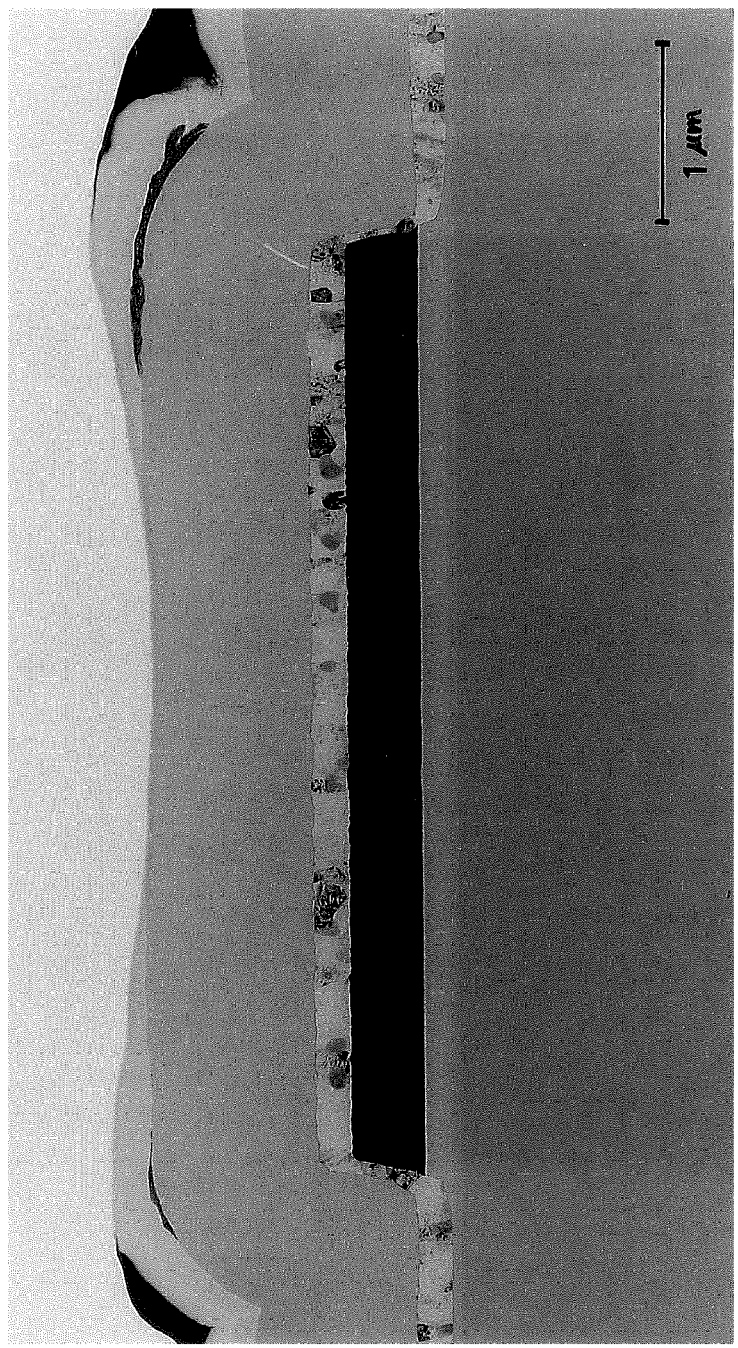
FIG. 22 is a cross sectional photograph of a contact portion of a gate electrode and a gate wiring taken by transmission electron microscope.
Figure 23:
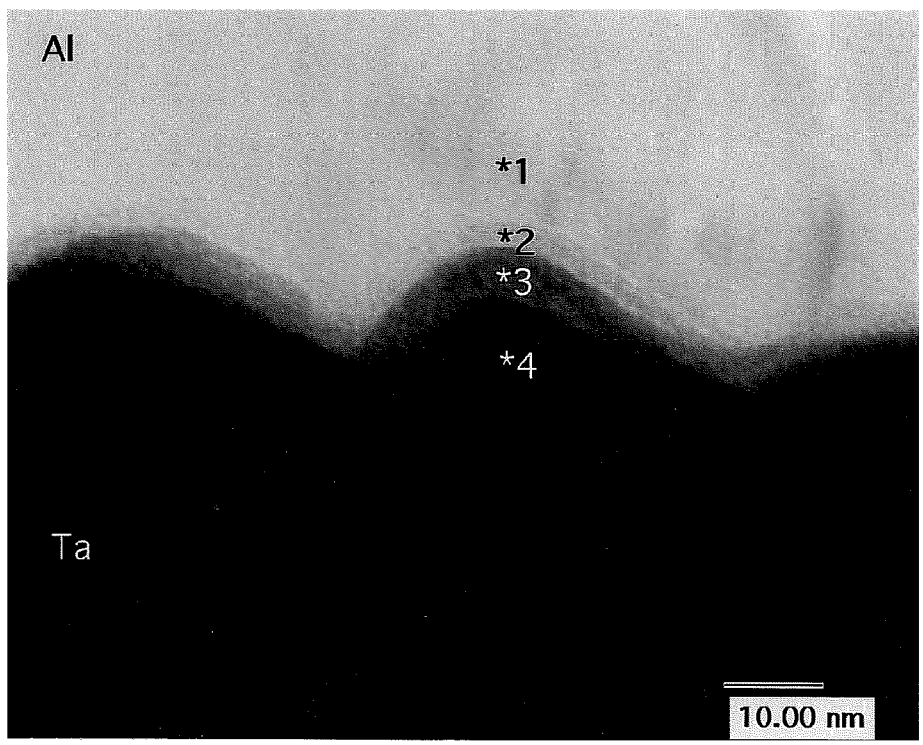
FIG. 23 is a cross sectional photograph of an interface in a gate electrode (Ta) and a gate wiring (Al—Nd) taken by transmission electron microscope.

FIG. 22 shows the result of observing the overlapped section of a gate electrode formed by laminating TaN film and Ta film, and Al—Nd film by transmission electron microscope (TEM). FIG. 23 is an enlargement at the interface between Ta Film and Al—Nd film, and the components were detected by energy dispersion X-ray spectroscopy (EDX) at the points denoted as *1 to *4 in the Figure. As a result, though Al is detected at *1 and Ta at *4, it was found that layers that include an oxide were formed because Al and oxygen was detected at *2, and Ta and oxygen was detected at *3. The cause is presumed that the surface of Ta film is oxidized in the heat treatment process for impurity element activation that was performed after forming Ta film as a gate electrode. When Al—Nd film is further formed, oxygen in the surface of Ta film presumably oxidized the Al—Nd film. Such increase in the contact resistance was a result noticeably appeared when Ta was used.

Figure 26A:
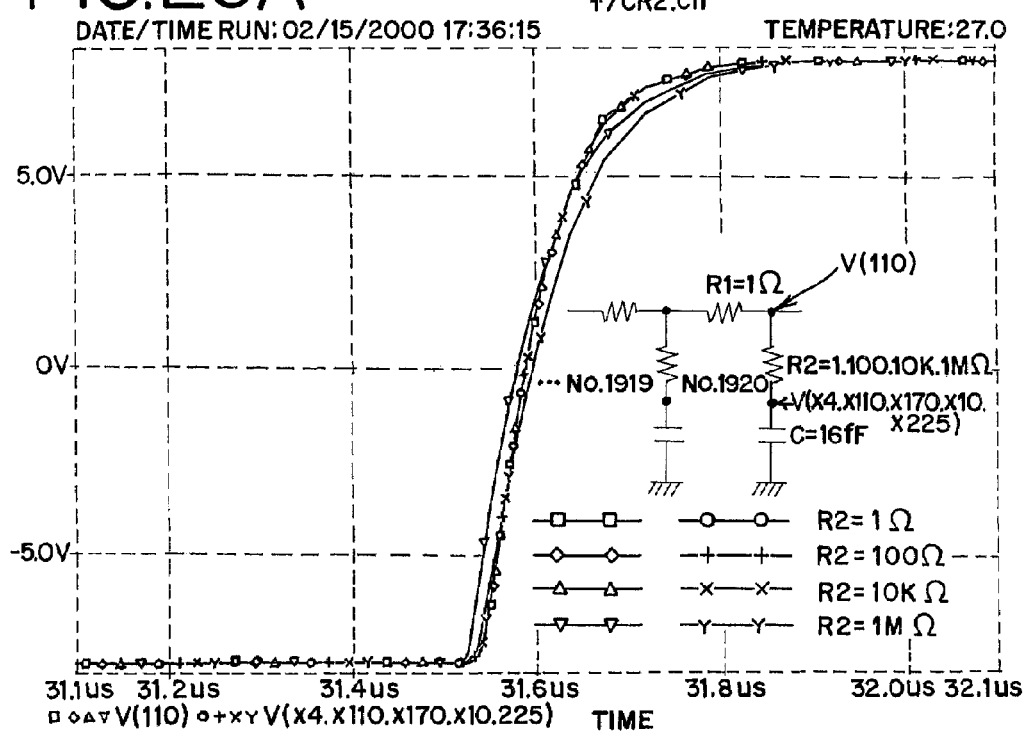
FIGS. 26A and 26B are calculative simulations of contact resistance in a gate electrode and a gate wiring.
Figure 26B:
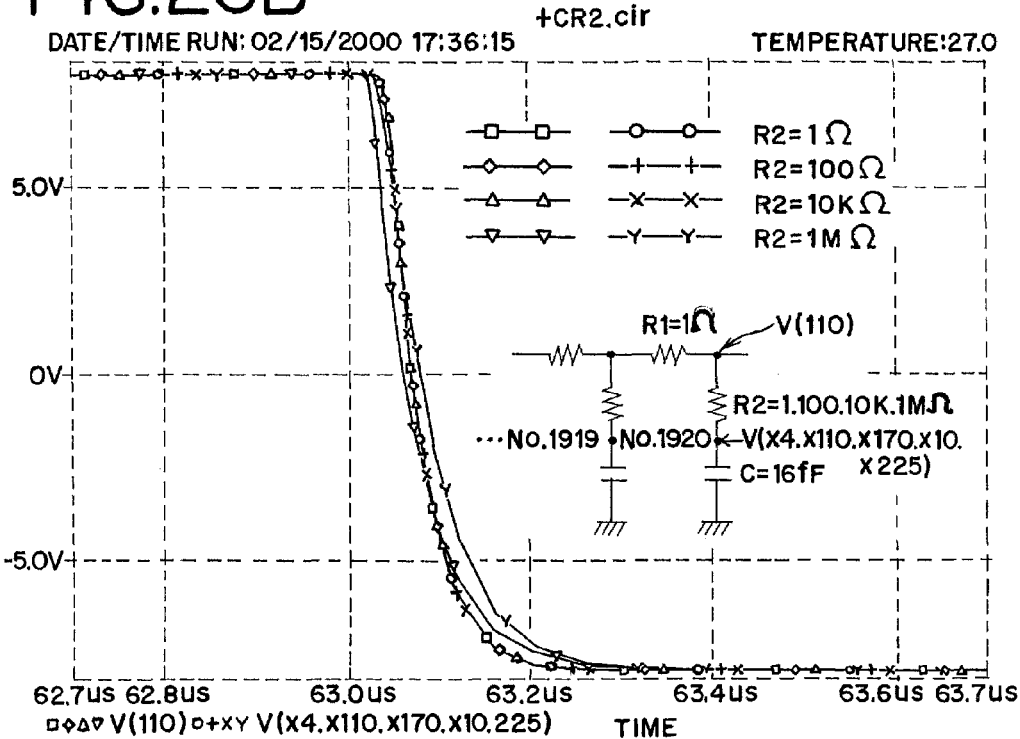

However, by testing by simulation the influence that was imposed on the signal waveform by the contact resistance, it was confirmed that it did not so much affect at contact resistance around 200Ω. FIGS. 26A and 26B show the difference due to the resistance in the rise of the waveform and in the fall of the waveform. The equivalent circuit used for calculation is shown inserted in the Figures. The simulation was made here by varying R2 which corresponds to contact resistance from 1Ω to 1 MΩ and it was confirmed that the influence by the contact resistance was scarcely found up to approximately 10 kΩ.

Further, conduction test was performed as the reliability test of the contact section, and difference in the contact resistance was examined. Test samples having contact section area 40 μm$^2$ and contact number 200 were fabricated, and 1 mA electric current was conducted for 1 hour in the atmosphere at 180° C. Though difference in contact resistance was tested for the gate electrode materials of above stated 2 kinds, the difference was scarcely observed.

Embodiment 2

Figure 24A:
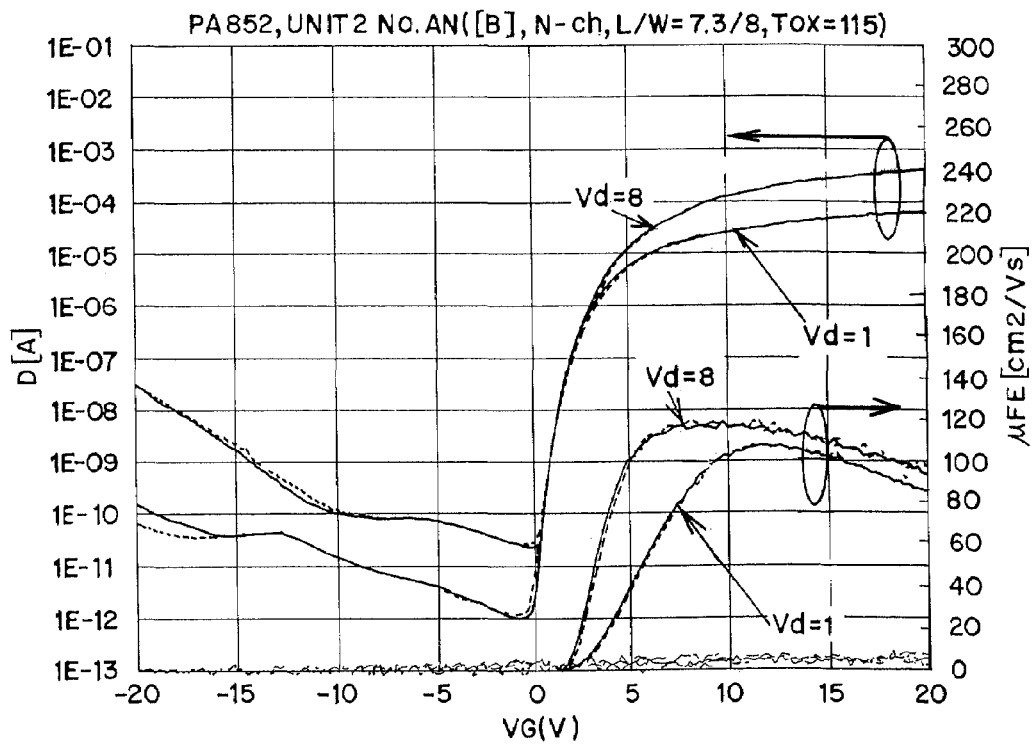
FIGS. 24A and 24B are $V_G$-$I_D$ characteristic and an investigation by bias-thermal stress test of TFT.
Figure 24B:
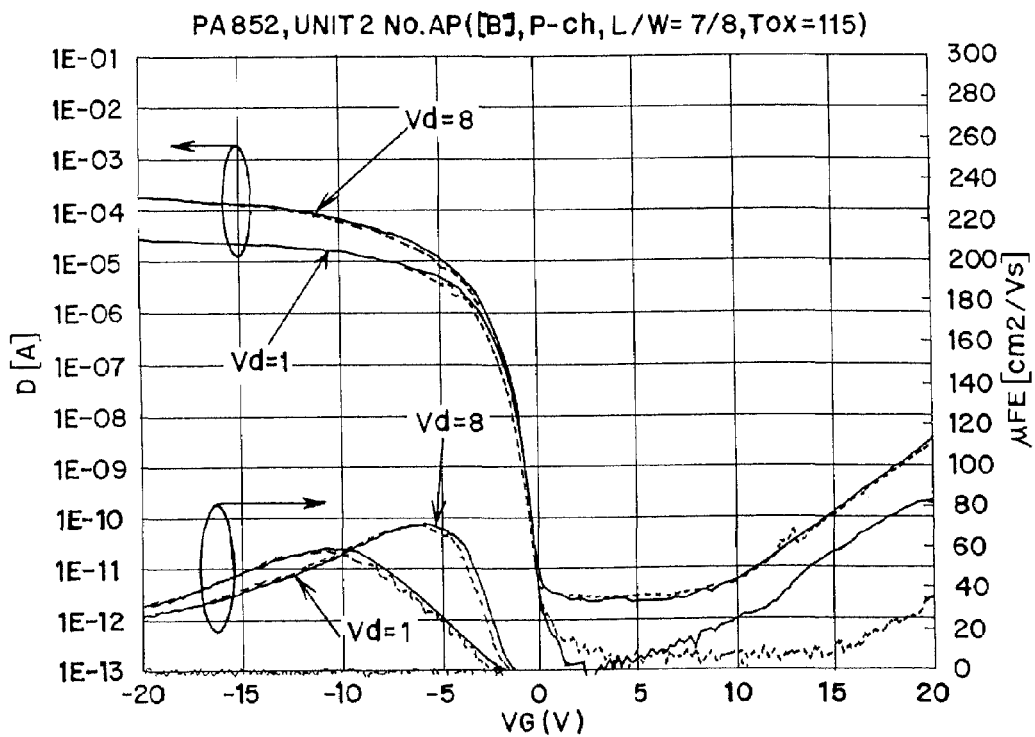

The reliability of fabricated TFT was investigated by bias-thermal stress test (hereinafter denoted as BT test). The size of the TFT was channel length 8 μm and channel width 8 μm. The conditions for the test was that gate voltage of +20V and gate voltage of OV was applied to n-channel TFT and held under 150° C. for 1 hour. FIGS. 24A and 24B show the result for n-channel TFT and p-channel TFT respectively but degradation due to bias stress was scarcely observed in either case.

Embodiment 3

Figure 25A:
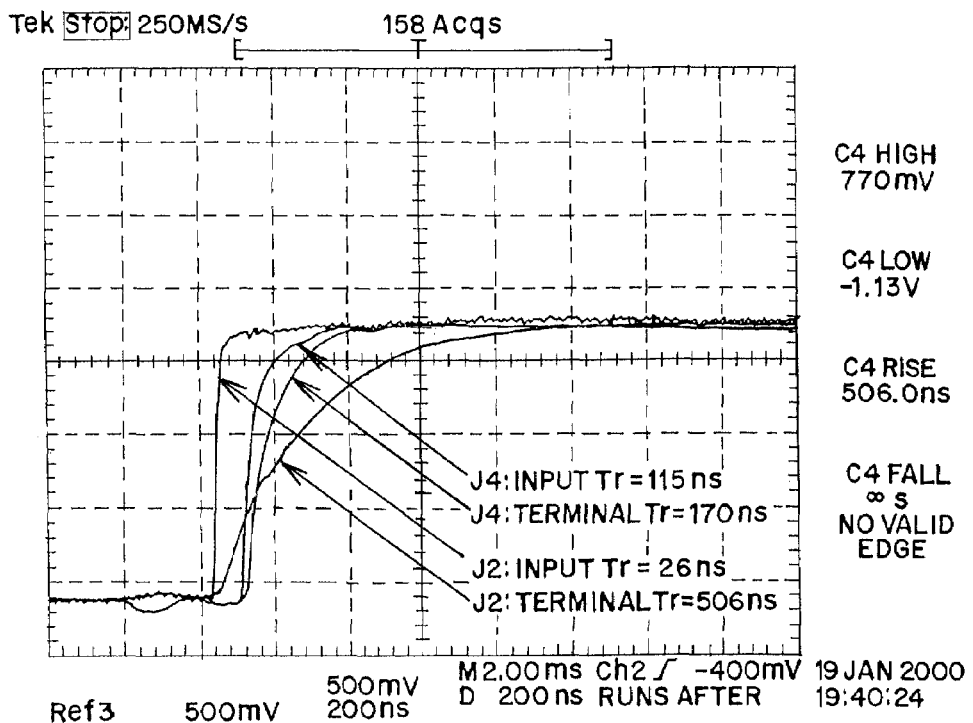
FIGS. 25A and 25B are differences in waveform between the signal input section and the terminal section, where 25A shows the rise of the waveform and 25B shows the fall of the waveform.
Figure 25B:
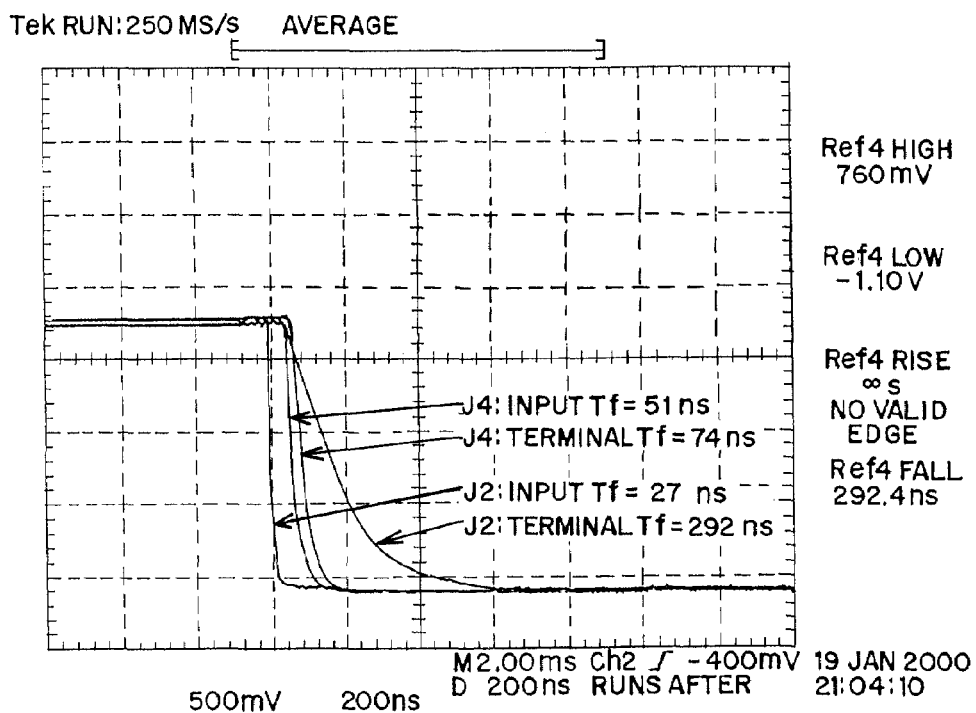

Influence of signal delay due to difference of gate wiring material was evaluated. FIGS. 25A and 25B show the difference in the waveform between the signal input section and the terminal section, where 25A shows the rise of the waveform and 25B shows the fall of the waveform. The distance between the input section and the terminal section is 83 mm. In FIGS. 25A and 25B the characteristic denoted as J2 is for gate wiring which was formed from lamination of TaN film and Ta film, and a sample denoted as J4 is a sample formed with a gate wiring of Al—Nd film. The width of the gate wiring is 10 μm. While the former sample has a large difference between the input section and the terminal section for rising time and falling time, the latter sample has a very small difference. The delay time of J2 sample was approximately 10 times as much as that of J4 sample, and as clear from sheet resistance shown in Table 1 it can be presumed that the resistance of the wiring material affect the delay time.

TABLE 3 unit: nsec.

| | rise | | fall | |
|---|---|---|---|---|
| | J4 structure | J2 structure | J4 structure | J2 structure |
| input section | 115 | 26 | 51 | 27 |
| terminal section | 170 | 506 | 74 | 292 |
| difference in delay | 55 | 480 | 23 | 265 |

From the results above, it was shown that it is necessary to form gate wiring connected to the gate electrode, from a low resistance material like as in the present invention in case that the display size is 4 inches or larger.

By using the present invention it is possible to dispose a TFT with performance suited for the specifications required for functional circuits in a semiconductor device (specifically an electro-optical device in this instance) having multiple functional circuits formed on the same substrate, thus allowing vast improvement in the operating characteristics and reliability. In particular, by forming the LDD region of the n-channel TFT of the pixel matrix circuit with an n$^{--}$ concentration and as an $L_{off}$ alone, the off-current value can be drastically decreased, to contribute to lower power consumption of the pixel matrix circuit. Moreover, by forming the LDD region of the n-channel TFT of the driver circuit with an n$^-$ concentration and as an $L_{ov}$ alone, it is possible to increase the current driving capacity and prevent deterioration by hot carriers, to thus reduce deterioration of the on-current value. It is also possible to improve the operation performance and reliability of semiconductor devices (specifically electronic instruments in this instance) having such electro-optical devices as their display media.

Furthermore, by forming the gate electrodes of the pixel TFT and driver circuit TFT with a highly heat resistant, conductive material, and forming the gate wirings connecting the gate electrodes with low resistance materials such as aluminum (Al), it is possible to realize the aforementioned satisfactory TFT characteristics and to use such TFTs to realize large-sized display devices of 4-inch class or larger.

What is claimed is:

1. A semiconductor device having a pixel TFT provided in a display region and a driver circuit TFT provided in a driver circuit, both TFTs formed over a same substrate, said semiconductor device comprising:

said pixel TFT comprising at least one lightly doped region disposed so as not to overlap a gate electrode of said pixel TFT;

a first n-channel TFT of said driver circuit comprising at least one lightly doped region disposed so as to overlap a gate electrode of said first n-channel TFT; and a second n-channel TFT of said driver circuit comprising at least one lightly doped region disposed so that at least a portion thereof overlaps a gate electrode of said second n-channel TET, wherein said gate electrode of said pixel TFT and a gate electrode of said driver circuit TFT comprise a first conductive layer, and wherein said gate electrodes of said pixel TFT and said driver circuit TFT are in electrical contact with gate wirings comprising a second conductive layer in areas outside channel-forming regions of said pixel TFT and said driver circuit TFT.

2. A semiconductor device according to claim 1, wherein a storage capacitor is formed in said display region by a semiconductor layer connected to a source or a drain region of said pixel TFT and containing a single conductive impurity element, a capacitor wiring and an insulating film between said semiconductor layer and said capacitor wiring, and wherein said capacitor wiring is formed by said first conductive layer and said second conductive layer.

3. A semiconductor device according to claim 1, wherein said first conductive layer comprises at least one selected from Ta, W, Ti and Mo, and said second conductive layer comprises Al or Cu.

4. A semiconductor device according to claim 1, wherein said first conductive layer comprises a conductive layer (A) containing nitrogen and at least one selected from Ta, W, Ti and Mo, a conductive layer (B) formed on said conductive layer (A) and comprising at least one selected from Ta, W, Ti and Mo, and a conductive layer (C) formed on regions where said conductive layer (B) does not contact said conductive layer (A) and containing nitrogen and at least one selected from Ta, W, Ti and Mo, and wherein said second conductive layer comprises a conductive layer (D) comprising Al or Cu and a conductive layer (E) comprising at least one selected from Ta, W, Ti and Mo.

5. A semiconductor device according to claim 4, wherein said conductive layer (B) contains argon, and an oxygen concentration in said conductive layer (B) is 30 ppm or less.

6. A semiconductor device according to claim 1, wherein said semiconductor device is an EL display device.

7. A semiconductor device according to claim 1, wherein said semiconductor device is one selected from the group consisting of a personal computer, a video camera, a portable information terminal, a digital camera and a digital video disk player.

8. A semiconductor device according to claim 1, wherein said semiconductor device is an active matrix-type liquid crystal display device.

9. A semiconductor device according to claim 1, wherein each of said gate wirings is in contact with a side surface of said gate electrode of said pixel TFT and a side surface of said gate electrode of said driver circuit TFT.

10. A semiconductor device having a display region and a driver circuit provided over a same substrate, said semiconductor device comprising:

said display region comprising a pixel TFT provided with a lightly doped region not overlapping a gate electrode of said pixel TFT; and said driver circuit comprising at least a first n-channel TFT provided with a lightly doped region overlapping a gate electrode of said first n-channel TFT and a second n-channel TFT provided with a portion of a lightly doped region overlapping a gate electrode of said second n-channel TFT, wherein at least said gate electrodes of said pixel TFT and said first and second n-channel TFTs comprises a first conductive layer, wherein a gate wiring connected to said gate electrode of said pixel TFT comprises a second conductive layer, and wherein said gate electrode of said pixel TFT and said gate wiring are electrically connected in an area outside a channel-forming region of said pixel TFT.

11. A semiconductor device according to claim 10, wherein a storage capacitor is formed in said display region by a semiconductor layer connected to a source or a drain region of said pixel TFT and containing a single conductive impurity element, a capacitor wiring and an insulating film between said semiconductor layer and said capacitor wiring, and wherein said capacitor wiring is formed by said first conductive layer and said second conductive layer.

12. A semiconductor device according to claim 10, wherein said first conductive layer comprises at least one selected from Ta, W, Ti and Mo, and said second conductive layer comprises Al or Cu.

13. A semiconductor device according to claim 10, wherein said first conductive layer comprises a conductive layer (A) containing nitrogen and at least one selected from Ta, W, Ti and Mo, a conductive layer (B) formed on said conductive layer (A) and comprising at least one selected from Ta, W, Ti and Mo, and a conductive layer (C) formed on regions where said conductive layer (B) does not contact said conductive layer (A) and containing nitrogen and at least one selected from Ta, W, Ti and Mo, and wherein said second conductive layer comprises a conductive layer (D) comprising Al or Cu and a conductive layer (E) comprising at least one selected from Ta, W, Ti and Mo.

14. A semiconductor device according to claim 13, wherein said conductive layer (B) contains argon, and an oxygen concentration in said conductive layer (B) is 30 ppm or less.

15. A semiconductor device according to claim 10, wherein said semiconductor device is an EL display device.

16. A semiconductor device according to claim 10, wherein said semiconductor device is one selected from the group consisting of a personal computer, a video camera, a portable information terminal, a digital camera and a digital video disk player.

17. A semiconductor device according to claim 10, wherein said semiconductor device is an active matrix-type liquid crystal display device.

18. A semiconductor device according to claim 10, wherein said gate wiring is in contact with a side surface of said gate electrode of said pixel TFT.

19. A semiconductor device comprising:
a semiconductor layer over a substrate, said semiconductor layer comprising a pair of impurity regions and a channel-forming region interposed therebetween;
a gate electrode over said channel-forming region with a gate insulating film interposed therebetween, said gate electrode comprising a first conductive layer;
a gate wiring in contact with said gate electrode, said gate wiring comprising a second conductive layer; and
a storage capacitor comprising a portion of said semiconductor layer, a portion of said gate insulating film, a third conductive layer comprising the same material as said first conductive layer, and a fourth conductive layer comprising the same material as said second conductive layer.

20. A semiconductor device according to claim 19, wherein said first conductive layer comprises at least one selected from Ta, W, Ti and Mo, and said second conductive layer comprises Al or Cu.

21. A semiconductor device according to claim 19, wherein said semiconductor device is an EL display device.

22. A semiconductor device according to claim 19, wherein said semiconductor device is one selected from the group consisting of a personal computer, a video camera, a portable information terminal, a digital camera and a digital video disk player.

23. A semiconductor device according to claim 19, wherein said semiconductor device is an active matrix-type liquid crystal display device.

24. A semiconductor device according to claim 19, wherein said gate wiring is in contact with a side surface of said gate electrode.

25. A semiconductor device comprising:
a semiconductor layer over a substrate, said semiconductor layer comprising a pair of impurity regions and a channel-forming region interposed therebetween;
a gate electrode over said channel-forming region with a gate insulating film interposed therebetween, said gate electrode comprising a first conductive layer;
a gate wiring overlapping said gate electrode, said gate wiring comprising a second conductive; and
a storage capacitor comprising a portion of said semiconductor layer, a portion of said gate insulating film, a third conductive layer comprising same material as said first conductive layer, and a fourth conductive layer comprising same material as said second conductive layer.

26. A semiconductor device according to claim 25, wherein said first conductive layer comprises at least one selected from Ta, W, Ti and Mo, and said second conductive layer comprises Al or Cu.

27. A semiconductor device according to claim 25, wherein said semiconductor device is an EL display device.

28. A semiconductor device according to claim 25, wherein said semiconductor device is one selected from the group consisting of a personal computer, a video camera, a portable information terminal, a digital camera and a digital video disk player.

29. A semiconductor device according to claim 25, wherein said semiconductor device is an active matrix-type liquid crystal display device.

30. A semiconductor device according to claim 25, wherein said gate wiring is in contact with a side surface of said gate electrode.

31. A semiconductor device comprising:
a semiconductor layer over a substrate, said semiconductor layer comprising a pair of impurity regions and a channel-forming region interposed therebetween;
a gate electrode over said channel-forming region with a gate insulating film interposed therebetween, said gate electrode comprising a first conductive layer;
a gate wiring in contact with said gate electrode, said gate wiring comprising a second conductive layer, wherein said gate wiring is provided outside said channel-forming region; and
a storage capacitor comprising a portion of said semiconductor layer, a portion of said gate insulating film, a third conductive layer comprising the same material as said first conductive layer, and a fourth conductive layer comprising the same material as said second conductive layer.

32. A semiconductor device according to claim 31, wherein said first conductive layer comprises at least one selected from Ta, W, Ti and Mo, and said second conductive layer comprises Al or Cu.

33. A semiconductor device according to claim 31, wherein said semiconductor device is an EL display device.

34. A semiconductor device according to claim 31, wherein said semiconductor device is one selected from the group consisting of a personal computer, a video camera, a portable information terminal, a digital camera and a digital video disk player.

35. A semiconductor device according to claim 31, wherein said semiconductor device is an active matrix-type liquid crystal display device.

36. A semiconductor device according to claim 31, wherein said gate wiring is in contact with a side surface of said gate electrode.

* * * * *